(12) United States Patent
Tomida et al.

(10) Patent No.: US 8,912,988 B2
(45) Date of Patent: Dec. 16, 2014

(54) EL DISPLAY PANEL, POWER SUPPLY LINE DRIVE APPARATUS, AND ELECTRONIC DEVICE

(71) Applicant: Sony Corporation, Tokyo (JP)

(72) Inventors: Masatsugu Tomida, Kanagawa (JP); Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/269,644

(22) Filed: May 5, 2014

(65) Prior Publication Data

US 2014/0240206 A1 Aug. 28, 2014

Related U.S. Application Data

(63) Continuation of application No. 12/589,609, filed on Aug. 20, 2012, which is a continuation of application No. 12/213,143, filed on Jun. 16, 2008, now Pat. No. 8,269,696.

(30) Foreign Application Priority Data

Jun. 30, 2007 (JP) ................. 2007-173590

(51) Int. Cl.
*G09G 3/30* (2006.01)
*G09G 3/32* (2006.01)
(52) U.S. Cl.
CPC ............... *G09G 3/30* (2013.01); *G09G 3/3233* (2013.01); *G09G 3/3266* (2013.01); *G09G 2300/0426* (2013.01); *G09G 2300/0819* (2013.01); *G09G 2300/0842* (2013.01); *G09G 2300/0866* (2013.01); *G09G 2310/0256* (2013.01); *G09G 2320/043* (2013.01); *G09G 2320/045* (2013.01); *G09G 2330/02* (2013.01)
USPC ........................................ 345/76; 315/169.3

(58) Field of Classification Search
CPC ............ H01L 27/3244; H01L 27/3297; H01L 23/5283; H01L 23/5286; G09G 2330/02; G09G 2330/028; G09G 2310/0291; G09G 3/22; G09G 3/30; G09G 3/32; G09G 3/3208; G09G 3/3233; G09G 2300/0426; G09G 2300/0819; G09G 2300/0842; G09G 2300/0866; G09G 2310/0256; G09G 2320/043; G09G 2320/045; G09G 3/3266
USPC ........................... 345/76–83, 204; 315/169.3
See application file for complete search history.

(56) References Cited

U.S. PATENT DOCUMENTS

| | | | |
|---|---|---|---|
| 6,028,580 | A | 2/2000 | Kosegawa et al. |
| 6,489,689 | B2 | 12/2002 | Nojiri |
| 7,102,202 | B2 | 9/2006 | Kobayashi et al. |
| 7,109,952 | B2 | 9/2006 | Kwon |
| 7,256,774 | B1 | 8/2007 | Senda et al. |
| 7,315,296 | B2 | 1/2008 | Koyama et al. |

(Continued)

FOREIGN PATENT DOCUMENTS

| | | |
|---|---|---|
| JP | 02-051252 A | 2/1990 |
| JP | 11-338439 A | 12/1999 |

(Continued)

OTHER PUBLICATIONS

Japanese Office Action issued Feb. 28, 2012 for corresponding Japanese Application No. 2007-173590.

*Primary Examiner* — Stephen Sherman
(74) *Attorney, Agent, or Firm* — Rader, Fishman & Grauer PLLC

(57) ABSTRACT

Disclosed herein is an electroluminescence display panel including a pixel circuit, a signal line, a scan line, a drive power supply line, a common power supply line, a power supply line drive circuit, a high-potential power supply line, and a low-potential power supply line.

11 Claims, 34 Drawing Sheets

(56) References Cited

U.S. PATENT DOCUMENTS

| | | | |
|---|---|---|---|
| 7,868,883 | B2 | 1/2011 | Mochizuki et al. |
| 2005/0206590 | A1 | 9/2005 | Sasaki et al. |
| 2005/0225518 | A1 | 10/2005 | Yamada et al. |

FOREIGN PATENT DOCUMENTS

| | | |
|---|---|---|
| JP | 2003-255856 A | 9/2003 |
| JP | 2003-271095 A | 9/2003 |
| JP | 2004-021219 A | 1/2004 |
| JP | 2004-029791 A | 1/2004 |
| JP | 2004-055529 A | 2/2004 |
| JP | 2004-093682 A | 3/2004 |
| JP | 2004-118015 A | 4/2004 |
| JP | 2004-145300 A | 5/2004 |
| JP | 2004-145301 A | 5/2004 |
| JP | 2005-309003 A | 11/2005 |
| JP | 2006-003889 A | 1/2006 |
| JP | 2006-349753 A | 12/2006 |
| JP | 2007-041346 A | 2/2007 |
| WO | WO-2008/038635 A1 | 4/2008 |

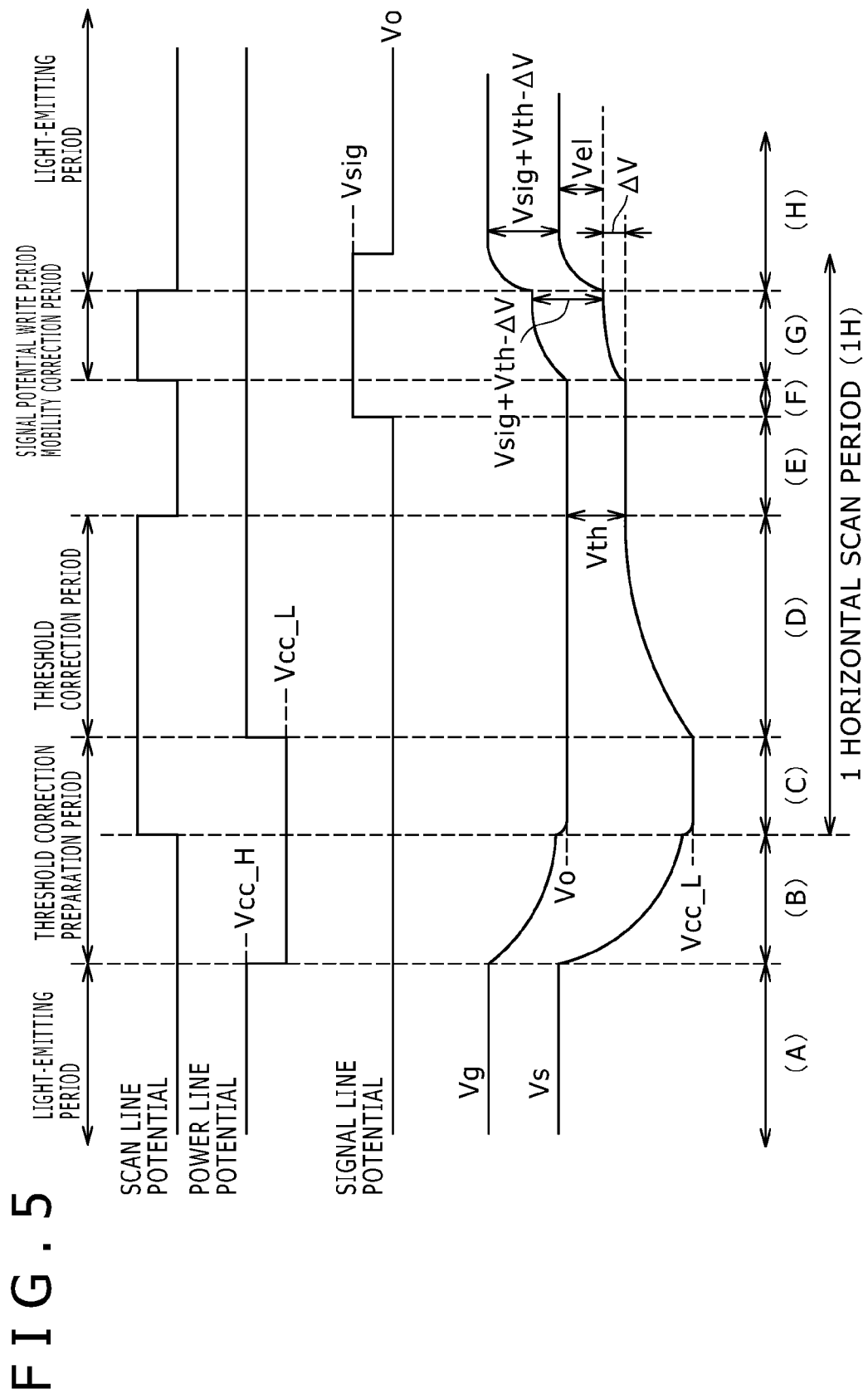

THRESHOLD NOT CORRECTED +
MOBILITY $\mu$ NOT CORRECTED

THRESHOLD CORRECTED + MOBILITY μ CORRECTED

EL DISPLAY PANEL, POWER SUPPLY LINE DRIVE APPARATUS, AND ELECTRONIC DEVICE

CROSS REFERENCES TO RELATED APPLICATIONS

This is a Continuation Application of U.S. application Ser. No. 13/589,609, filed on Aug. 20, 2012, which is a Continuation Application of U.S. application Ser. No. 12/213,143, filed Jun. 16, 2008, now U.S. Pat. No. 8,269,696, issued on Sep. 18, 2012. The present invention contains subject matter related to Japanese Patent Application JP 2007-173590 filed in the Japan Patent Office on Jun. 30, 2007, the entire contents of which being incorporated herein by reference.

BACKGROUND OF THE INVENTION

1. Field of the Invention

The present invention relates to a technology for enhancing the yield of EL (Electro Luminescence) display panels and has modes of as an EL display panel, a power supply line drive apparatus, and an electronic device. It should be noted that the EL display panel denotes a self-illuminant display apparatus with EL devices arranged in matrix on a substrate made of glass or other materials.

2. Description of the Related Art

Recently, organic EL panels on which organic EL devices are arranged in matrix have been drawing attention. This is because organic EL panels are excellent in moving picture display characteristics as well as easy in reducing apparatus weight and film thickness.

Currently, two organic EL panel driving schemes are available; passive matrix driving and active matrix driving. Especially, organic EL panels based on the active matrix driving in which an active element (a thin-film transistor) and a hold capacity are arranged for every pixel circuit are under brisk development.

The following shows documents associated with the active matrix driving, for example.

Patent Document 1: Japanese Patent Laid-Open No. 2003-255856

Patent Document 2: Japanese Patent Laid-Open No. 2003-271095

Patent Document 3: Japanese Patent Laid-Open No. 2004-029791

Patent Document 4: Japanese Patent Laid-Open No. 2004-093682

As shown in the above-mentioned Patent Documents, the active matrix driving is of various types. Described in what follows is one of these driving schemes that controls the on state and the off state of each organic EL device by digitally driving one of two power supply lines for supplying a power supply potential to each pixel circuit.

Now, referring to FIG. 1, there is shown an exemplary pixel circuit of the above-mentioned type. A pixel circuit 1 is made up of two N-type thin-film transistors T1 and T2. Of these two transistors, the thin-film transistor T1 is a switching transistor that controls writing of a signal line voltage Vsig to a storage capacity Cs.

On the other hand, the thin-film transistor T2 is a driving transistor that supplies drive current Ids of a magnitude corresponding to a hold voltage Vgs of a storage capacity Cs to an organic EL device D1. The thin-film transistors T1 and T2 are connected to a signal line as follows.

A gate electrode of the thin-film transistor T1 is connected to a scan line SCNL(i) (i being a serial number indicative of row position) that gives a signal line potential write timing. In FIG. 1, a write timing signal is indicated by SCNL(i).

One main electrode of the thin-film transistor T1 is connected to a signal line DL(j) (j being a serial number indicative of a column position) and the other main electrode is connected to a gate electrode of the thin-film transistor T2 and an electrode of the storage capacity Cs.

One main electrode of the thin-film transistor T2 is connected to a drive power supply line DSL(i) (i being a serial number indicative of row position) and the other main electrode is connected to a positive electrode (or an anode electrode) of an organic EL device OLED. In FIG. 1, power supply potential of a high potential (also referred to as a high power supply potential) to be applied to a drive power supply line DSL(i) is indicated by Vcc_H and a power supply potential of low potential (also referred to as a low power supply potential) is indicated by Vcc_L1.

It should be noted that a negative electrode (or a cathode electrode) of the organic EL device OLED is connected to a common power supply line (or a ground line). In FIG. 1, a power supply potential of low potential to be applied to the common power supply line is indicated by Vcc_L2. Meanwhile, the organic EL device OLED is a current-driven element. Therefore, it is desired to flow a current (l*n) obtained by multiplying current l flowing through one pixel circuit by the number of pixels (or n times) to the drive power supply line DSL(i) that is emitting light.

Hence, a wiring resistance of the drive power supply line DSL(i) located on a route along which the power supply potential of high potential is supplied has to be relatively small. If the wiring resistance is large, a voltage drop difference occurs across the drive power supply line DSL(i) to cause problems of a luminance difference depending on the location of scan line and generating heat in the power supply line, for example.

If the number of stages of scan lines making up a valid display area is V, then it is desired to flow current (l*n*V) obtained by multiplying the number of pixels (n times) of current l flowing to one pixel circuit by the number of stages (V times) to a high-potential power supply line that supplies high-potential power supply potential Vcc_H to each drive power supply line DSL(i).

Consequently, it is technically necessary for both the drive power supply line DSL(i) and the high-potential power supply line to be relatively large in wiring width so as to lower the wiring resistance. The following describes these technological requirements with reference to FIGS. 2 and 3. FIG. 2 shows a connection relationship between the pixel circuit 1 and a power supply line drive circuit 3. FIG. 3 shows a wiring pattern of a connected portion between the drive power supply lines DSL and a power supply line drive circuit 7 (or an output stage buffer circuit).

The power supply line drive circuit 3 is made up of a shift register 5 that transfers a power supply line drive pulse to a next scan line for each horizontal scan interval and a buffer circuit 7 (2-stage configuration of input-stage buffer circuit and output-stage buffer circuit).

The two stages of buffer circuits making up the buffer circuit 7 are each configured by a CMOS inverter circuit. In the case of FIG. 2, each p-channel MOS transistor is connected to a high-potential power supply line 11 and each n-channel MOS transistor is connected to a low-potential power supply line 13.

Consequently, if the power supply drive pulse is at H level, high-potential power supply potential Vcc_H is supplied to the drive power supply line DSL(i); if the power supply line drive pulse is at L level, low-potential power supply potential Vcc_L is supplied to the drive power supply line DSL(i).

Meanwhile, if the drive power supply line DSL(i) wide in wiring and the high-potential power supply line 11 are arranged in a crossed manner, a resultant cross area becomes wide. And, this cross appears for every drive power supply line DSL(i). Therefore, let one cross area be S, then a cross area of the entire organic EL panel becomes as large as S*V (V being the number of scan lines or the number of vertical resolutions).

Thus, the wiring pattern shown in FIG. 3 that may not avoid the increase in cross area involves a problem of causing an inter-layer short circuit due to dust or the like. This, in turn, may raise the detect rate of organic EL panels. In addition, the above-mentioned wiring pattern causes an increased capacity that is parasitic to the cross portion, thereby increasing the distortion of a potential waveform of the drive power supply line DSL(i).

SUMMARY OF THE INVENTION (1) Layout Pattern 1

In carrying out the invention and according to one mode thereof, there is provided an EL (Electro Luminescence) display panel having:

(a) a pixel circuit, arranged on a pixel array block in matrix, configured to drivingly control an electro-luminescence element by active matrix driving;

(b) a signal line configured, connected to the pixel circuit of the pixel array block in unit of row, to supply pixel data corresponding to each pixel circuit to each pixel circuit in column unit, the signal line being provided in a number equal to the number of columns;

(c) a scan line, connected to the pixel circuit of the pixel array block, configured to control a timing of writing pixel data to each pixel circuit in row unit, the scan line being provided in a number equal to the number of row;

(d) a drive power supply line, connected to the pixel circuit of the pixel array block, configured to control a light-on state and a light-off of the pixel circuit in row unit by two types of power supply potentials, a high potential and a low potential, the drive power supply line being provided in a number equal to the number of row;

(e) a common power supply line, commonly connected to all pixel circuits of the pixel array, configured to supply the high-potential power supply potential in a fixed manner;

(f) a power supply line drive circuit configured to supply one of the high-potential power supply potential and the low-potential power supply potential to corresponding the drive power supply line on the basis of a power supply drive pulse;

(g) a high-potential power supply line arranged at a position where the high-potential power supply line does not cross the drive power line, the high-potential power supply line being a high-potential power supply line supplying a high-potential power supply potential to the power supply line drive circuit; and (h) a low-potential power supply line configured to supply a low-potential power supply potential to the power supply line drive circuit.

(2) Layout Pattern 2

In carrying out the invention and according to another mode thereof, there is provided an EL display panel having:

(a) a pixel circuit, arranged on a pixel array block in matrix, configured to drivingly control an electro-luminescence element by active matrix driving;

(b) a signal line, connected to the pixel circuit of the pixel array block in unit of row, configured to supply pixel data corresponding to each pixel circuit to each pixel circuit in column unit, the signal line being provided in a number equal to the number of columns;

(c) a scan line, connected to the pixel circuit of the pixel array block, configured to control a timing of writing pixel data to each pixel circuit in row unit, the scan line being provided in a number equal to the number of row;

(d) a drive power supply line, connected to the pixel circuit of the pixel array block, configured to control a light-on state and a light-off of the pixel circuit in row unit by two types of power supply potentials, a high potential and a low potential, the drive power supply line being provided in a number equal to the number of row;

(e) a common power supply line, commonly connected to all pixel circuits of the pixel array, configured to supply the low-potential power supply potential in a fixed manner;

(f) a power supply line drive circuit configured to supply one of the high-potential power supply potential and the low-potential power supply potential to corresponding the drive power supply line on the basis of a power supply drive pulse;

(g) a low-potential power supply line configured to supply a low-potential power supply potential to the power supply line drive circuit, the low-potential power supply line being wired at a position where the low-potential power supply line does not cross the drive power supply line; and (h) a high-potential power supply line configured to supply a high-potential power supply potential to the power supply line drive circuit, the high-potential power supply line being wired at a position where the high-potential power supply line does not cross the drive power supply line.

As described and according to the invention, use of the layout patterns proposed herein can eliminate the cross between a drive power supply line that is drivingly controlled in a binary manner by a high-potential power supply and a low-potential power supply and a high-potential power supply line. This novel configuration minimizes the possibility of causing an inter-layer short circuit due to dust or the like, thereby significantly enhancing the yield of in manufacturing EL panels.

BRIEF DESCRIPTION OF THE DRAWINGS

FIG. 5 is a timing chart indicative of an example of active matrix drive operation of a pixel circuit using a power supply line;

DETAILED DESCRIPTION OF THE PREFERRED EMBODIMENTS

This invention will be described in further detail by way of embodiments thereof, organic EL (Electro Luminescence) panels of active matrix type, with reference to the accompanying drawings. It should be noted that any portion that is not illustrated or written herein is applied with known technologies in the technical field concerned. It should also be noted that the embodiments described below are illustrative only and therefore not limited thereto.

(A) Structure Of The Organic El Panel

Figure 4:
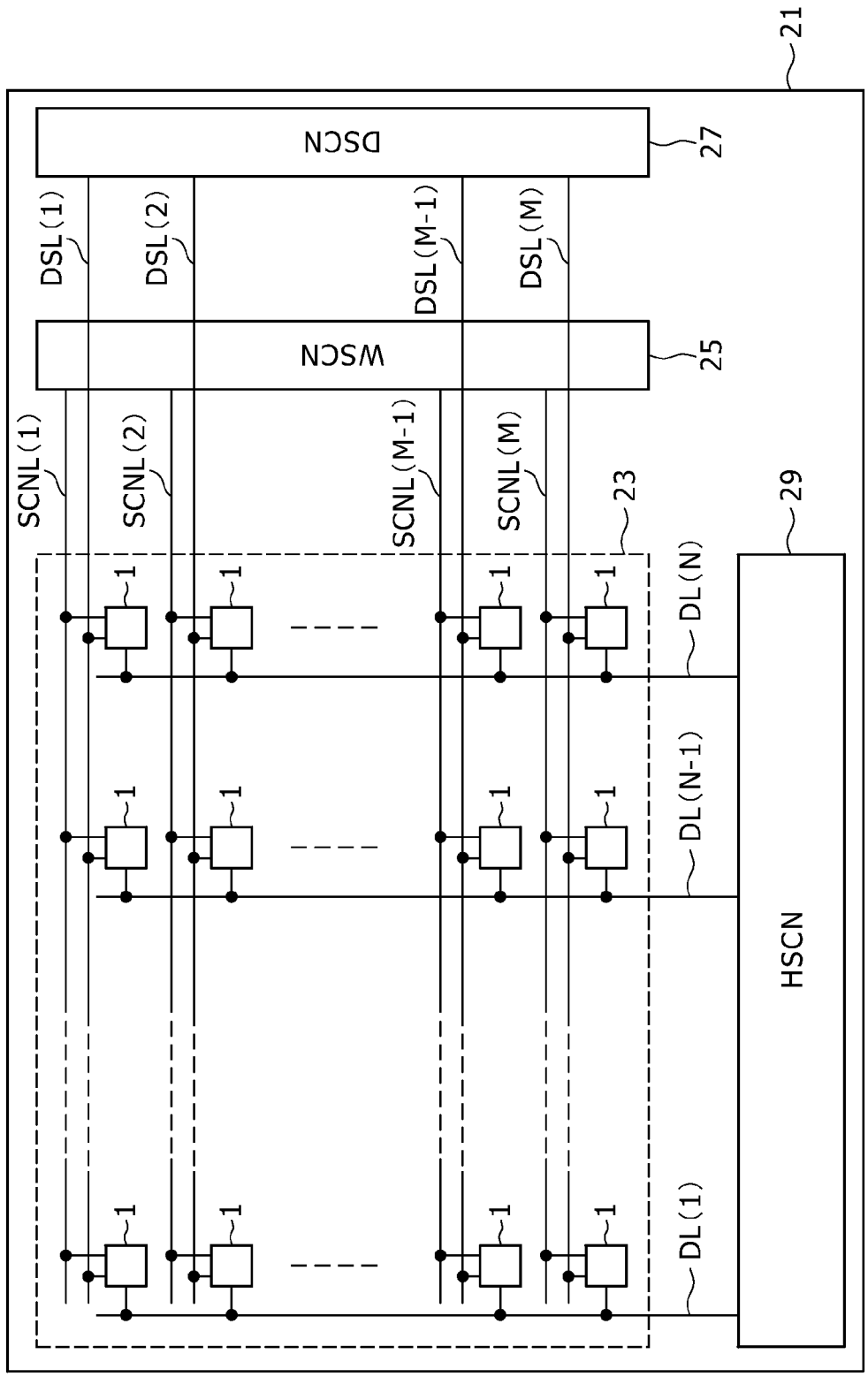
FIG. 4 is a circuit diagram illustrating an exemplary configuration of a display panel of active matrix drive type.

Now, referring to FIG. 4, there is shown an exemplary structure of an organic EL panel for realizing active matrix driving of the pixel circuit 1 by driving, in a binary manner, one of two power supply lines for supplying a power supply potential to the pixel circuit 1.

Figure 2:
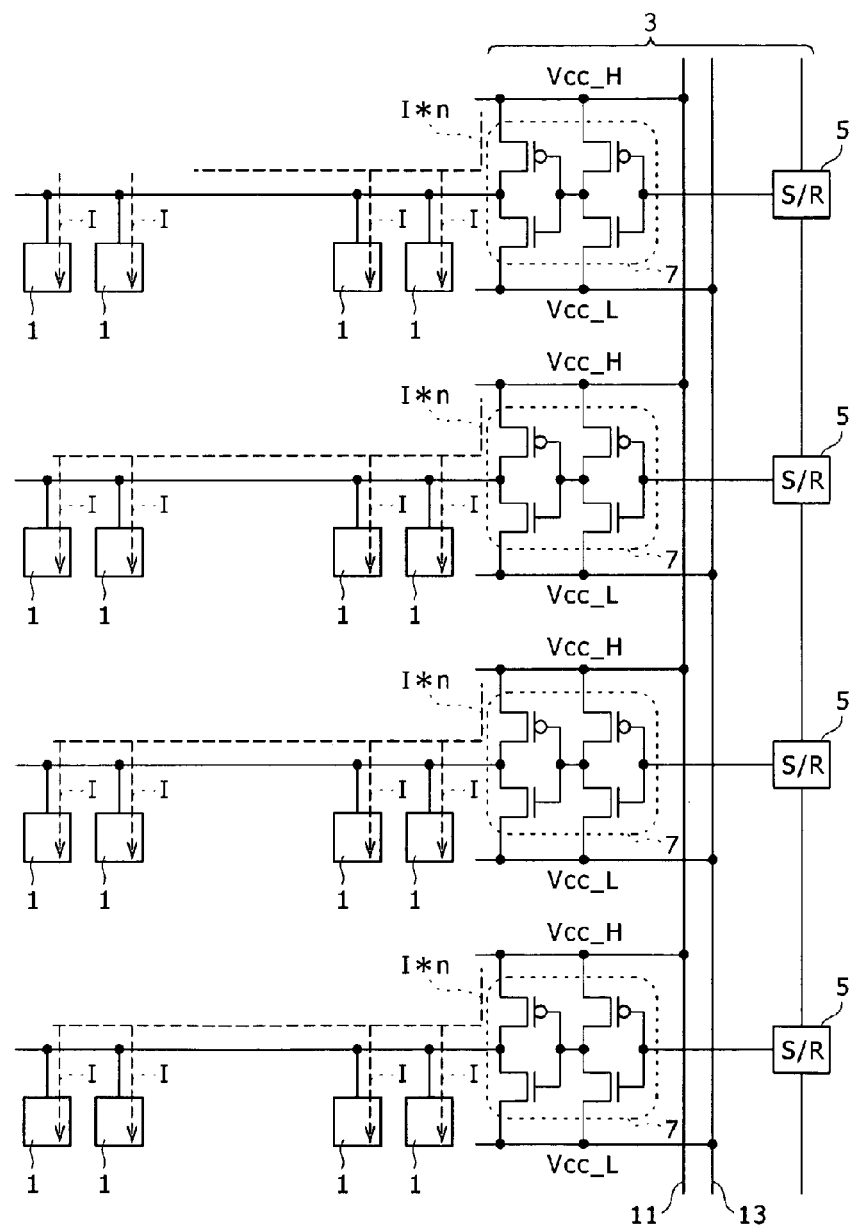
FIG. 2 is a circuit diagram illustrating a connection relationship of pixel circuit and drive power supply circuit.
Figure 3:
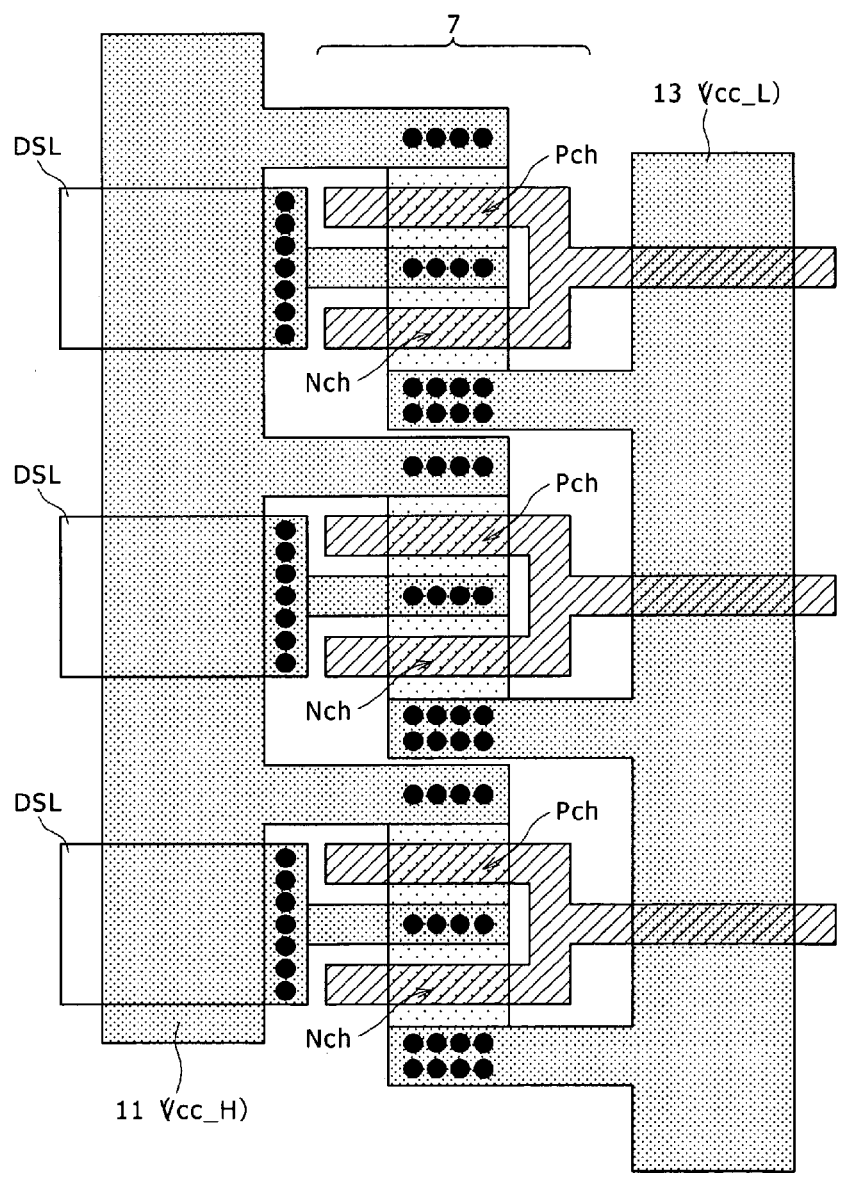
FIG. 3 is a schematic diagram illustrating wiring patterns of connection portions between drive power supply line and power supply line drive circuit.

An organic EL panel 21 is mainly made up of a pixel array block 23, a scan line drive circuit 25, a power supply line drive circuit 27 (corresponding to reference numeral 3 shown in FIG. 2), and a data line drive circuit 29. In the present embodiment, the pixel array block 23 with the pixel circuit 1 arranged in matrix in accordance with a screen resolution is for color display and arranged inside a valid screen accordance with the arrangement of luminescent color.

However, if an organic EL device having a structure in which organic luminescent layers of two or more colors are laminated makes up the pixel circuit 1, one pixel circuit 1 corresponds to two or more luminescent colors. The scan line drive circuit 25 is a circuit device configured to give, in a row unit (or a scan line unit) a write timing of a signal potential applied to signal line DL(j) to the pixel circuit 1.

It should be noted that a write timing signal is supplied to scan line SCNL(i) of a next stage for each horizontal scan interval.

The power supply line drive circuit 27 is a circuit device configured to drivingly control drive power supply line DSL (i). As described with reference to FIG. 2, the power supply line drive circuit 27 is made up of the shift register 5 corresponding to each scan line and a power supply line drive circuit 7.

It is possible for the power supply line drive circuit 27 to be formed not merely integrally on a same substrate as the pixel array block 23 but also as a device module discrete from the organic EL panel 21. A detail configuration of this power supply line drive circuit 27 will be described later.

The data line drive circuit 29 is a circuit device configured to drivingly control signal line DS(j). A signal voltage to be applied to signal line DL(j) is a threshold voltage Vo of corrective operation to be described later or a pixel position data voltage Vsig to be specified by a write timing signal.

(B) Drive Operation Of The Pixel Circuit

Referring to FIG. 5, there is shown an exemplary active matrix driving of the pixel circuit 1 by use of a power supply line. In the drive operation example shown in FIG. 5, a threshold correction operation and a mobility correction operation of the thin-film transistor T2 operating as a drive transistor are executed within one horizontal scan period (1H).

It should be noted that FIG. 5 shows potential changes of scan line SCNL(i), signal line DL(j), and drive power supply line DSL(i) along the same time axis. FIG. 5 also shows a change of gate potential Vg and a change of source potential Vs of the thin-film transistor T2 accompanying the potential changes of these lines. Besides, FIG. 5 shows a transition of potential changes, in 8 periods of (A) through (H) for the purpose of convenience.

(i) Light Emission Period

In period (A), the organic EL device OLED is in a light-emitting state. After this period, a new field of line sequential scan starts.

(ii) Threshold Correction Preparation Period

When a new field starts, a preparation for threshold correction is executed over periods (B) and (C). In period (B), drain current supply to the organic EL device OLED is stopped, upon which the organic EL device OLED stops emitting light. At this moment, the light-emitting voltage Vel of the organic EL device OLED undergoes a transition so as to draw toward zero.

In accordance with this drop of light-emitting voltage Vel, the source potential Vs of the thin-film transistor T2 makes a transition to almost the same potential as lower power supply potential Vcc_L for initialization. It should be noted that the gate potential Vg of the thin-film transistor T2 is initialized to reference potential Vo that is applied along the signal line DL(j) in the following period (C).

Executing these two initializing operations complete the initialization setting of the hold voltage of the hold capacity Cs. Namely, the hold voltage of the hold capacity Cs is initialized to a voltage (Vo−Vcc_L) larger than the threshold voltage Vth of the thin-film transistor T2. This is a threshold correction preparing operation.

(iii) Threshold Correcting Operation

Subsequently, a threshold correcting operation is executed for period (D). In this period (D) too, the reference potential Vo is given to the gate potential Vg. In this state, a high power supply potential Vcc_H is applied to the drive power supply line DSL(i).

As a result, the drain current flows to the signal line DL(j) through the hold capacity Cs to lower hold voltage Vgs of the hold capacity Cs. Accordingly, the source potential Vs of the thin-film transistor T2 rises.

It should be noted that the drop of the hold voltage Vgs of the hold capacity Cs stops when the hold voltage Vgs reaches the threshold voltage Vth upon which the thin-film transistor T2 cuts off. Thus, the threshold correcting operation for setting the hold voltage Vgs of the hold capacity Cs to the threshold voltage Vth unique to the thin-film transistor T2 is completed.

(iv) Signal Potential Write and Mobility Correction Preparing Operation

When a threshold correcting operation has been completed, a preparation for signal write and mobility correction is executed over periods (E) and (F). It should be noted that this preparing operation may be omitted. In period (E), the drive potential of scan line SCNL(i) is switched to low to float the thin-film transistor T2.

In period (F), the data voltage Vsig corresponding to pixel data is applied to the signal line DL(j). This period (F) is provided in consideration of a delay in the rise of the signal line potential due to the effect of the capacity component parasitic to the signal line DL(j). The existence of this period allows a write operation to be started with the potential of the signal line DL(j) stabilized in the next period (G).

(v) Signal Potential Write and Mobility Correcting Operation

In period (G), a signal potential write operation and a mobility correcting operation are executed. Namely, the drive potential of the scan line SCNL(i) is switched to high, applying the data potential Vsig to the gate potential of the thin-film transistor T2. When the data potential Vsig is applied, the hold voltage Vgs held in the hold capacity Cs makes a transition to Vsig+Vth. Thus, because the hold voltage Vgs gets larger than the threshold voltage Vth, the thin-film transistor T2 is turned on.

When the thin-film transistor T2 has been turned on, the drain current starts flowing to the organic EL device OLED. However, in the stage where the drain current starts flowing, the organic EL device OLED is still in a cutoff state (or high impedance). Therefore, in proportion to the mobility of the thin-film transistor T2, the drain current flows so as to charge parasitic capacity C0 of the organic EL device OLED.

The anode potential of the organic EL device OLED (namely, the source potential Vs of the thin-film transistor T2) rises by the charge voltage $\Delta V$ of this parasitic capacity C0. By this charge voltage $\Delta V$, the hold voltage Vgs of the hold capacity Cs lowers. Namely, the hold voltage Vgs changes to Vsig+Vth−$\Delta V$. Thus, an operation in which the hold voltage Vgs is corrected by the charge voltage $\Delta V$ of the parasitic capacity C0 corresponds to the mobility correcting operation.

It should be noted that a bootstrap operation of the hold capacity Cs raises the gate potential Vg of the thin-film transistor T2 by the same rise as that of the source potential Vs. To be more precise, the gate potential Vg rises by a potential obtained by multiplying the rise of the source potential Vs by gain g (<1).

(vi) Light-Emitting Period

In period (H), the drive potential of the scan line SCNL(i) is changed to low to put the gate electrode of the thin-film transistor T2 into a floating state. At this moment, the thin-film transistor T2 supplies a drain current equivalent to hold voltage Vgs after mobility correction (=Vsig+Vth−$\Delta V$) to the organic EL device OLED.

Consequently, the organic EL device OLED starts light emission. At this moment, the anode potential (the source potential Vs of the thin-film transistor T2) of the organic EL device OLED rises to the light-emitting voltage Vel in accordance with the magnitude of the drain current. At this moment, the gate potential Vg of the thin-film transistor T2 also rises by the light-emitting voltage Vel by the bootstrap operation of the hold capacity Cs. The gate potential Vg rises by a potential obtained by multiplying the rise of the source potential Vs by gain g (<1).

(C) Changes Of Connection State And Potential In Pixel Circuit

The following schematically describes the potential state changes inside the pixel circuit 1 corresponding to the period described with reference to FIG. 5. The following description is made by use of same reference numbers as the corresponding periods. Namely, the following description is made with reference to FIGS. 6A through 6H. It should be noted that, with FIGS. 6A through 6H, the thin-film transistor T1 that operates as a sampling transistor is indicated as a switch and the parasitic capacity of the organic EL device OLED is explicitly indicated as C0.

(i) Light-Emitting Period

Figure 6A:
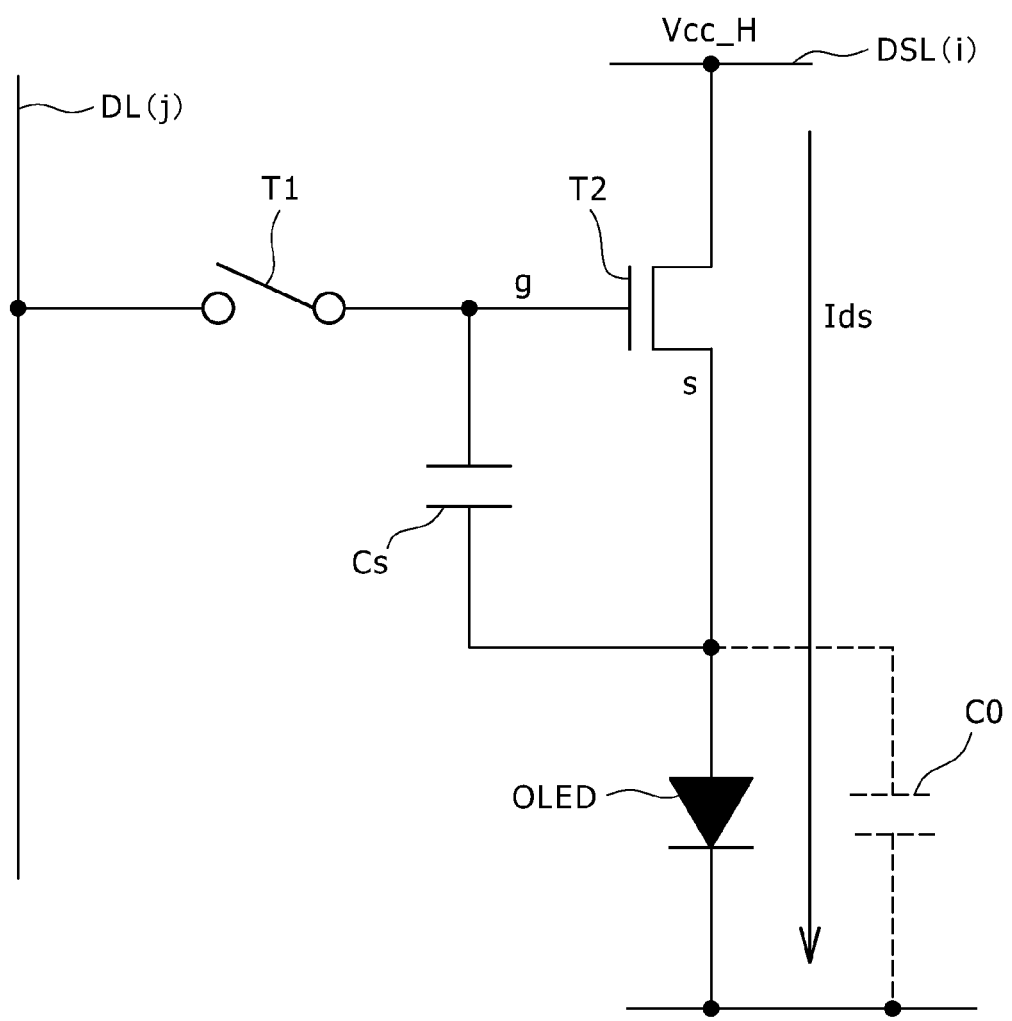
FIG. 6A is a circuit diagram illustrating a state in the pixel circuit corresponding to period (A) of FIG. 5.

FIG. 6A shows corresponds to an operation state of period (A) shown in FIG. 5. In period (A) that is a light-emitting period, high power supply potential Vcc_H for light emitting is applied to the drive power supply line DSL (i). At this moment, the thin-film transistor T2 supplies drain current Ids corresponding to the hold voltage Vgs (>Vth) of the hold capacity Cs to the organic EL device OLED. The light-emitting state of the organic EL device OLED continues until the end of period (A).

(ii) Threshold Correction Preparing Period

Figure 6B:
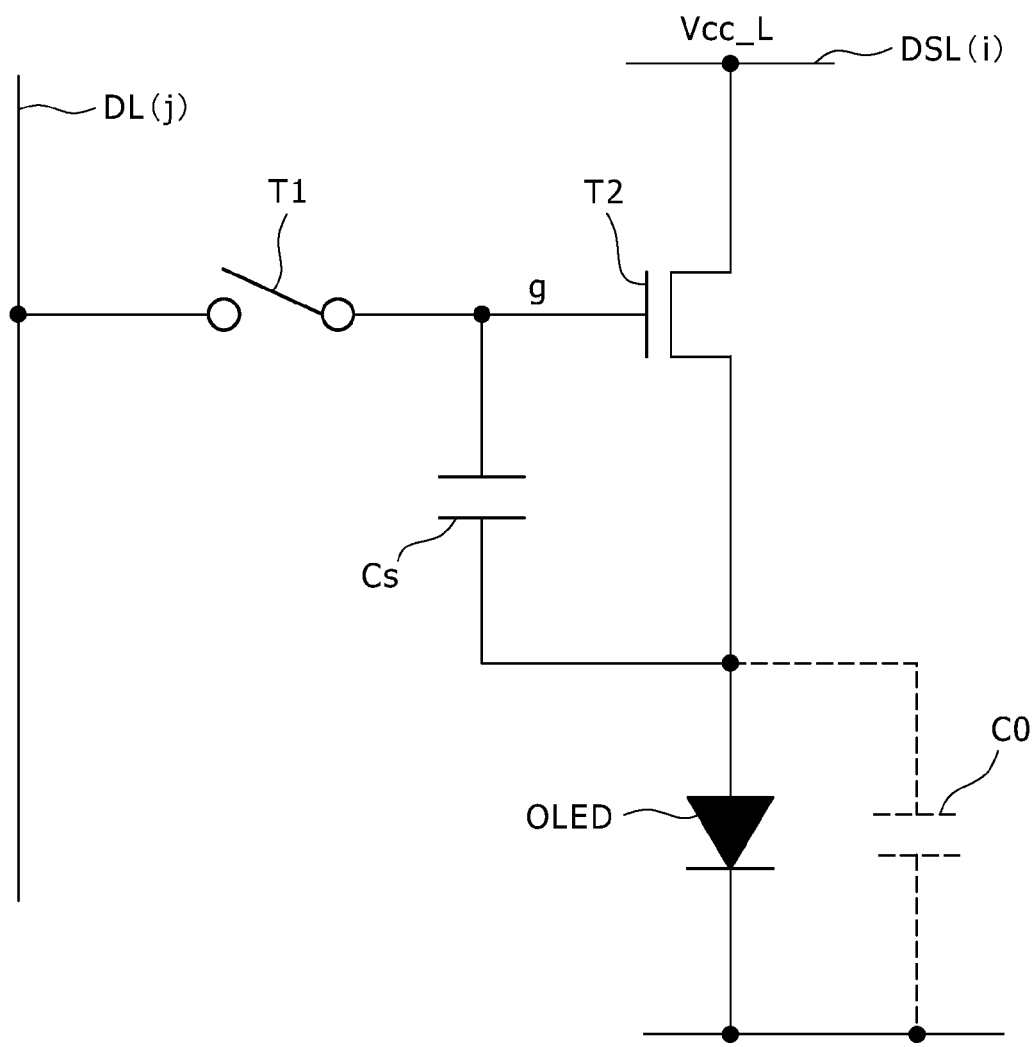
FIG. 6B is a circuit diagram illustrating a state in the pixel circuit corresponding to period (B) of FIG. 5.

FIG. 6B corresponds to an operation state of period (B) shown in FIG. 5. In period (B), the potential of the drive power supply line DSL(i) is switched from the light-emitting high power supply potential Vcc_H to the low power supply potential Vcc_L. This switching blocks the supplying of drain current Ids.

As a result, the gate potential Vg and the source potential Vs of the thin-film transistor T2 lower in cooperation with the lowering of the light-emitting voltage Vel of the organic EL device OLED. Then, the source potential Vs lowers to nearly the same level as the low power supply potential Vcc_L applied to the drive power supply line DSL(i). It should be noted that the low power supply potential Vcc_L is sufficiently lower than the reference potential Vo for initialization to be applied to the signal line DL(j).

Figure 6C:
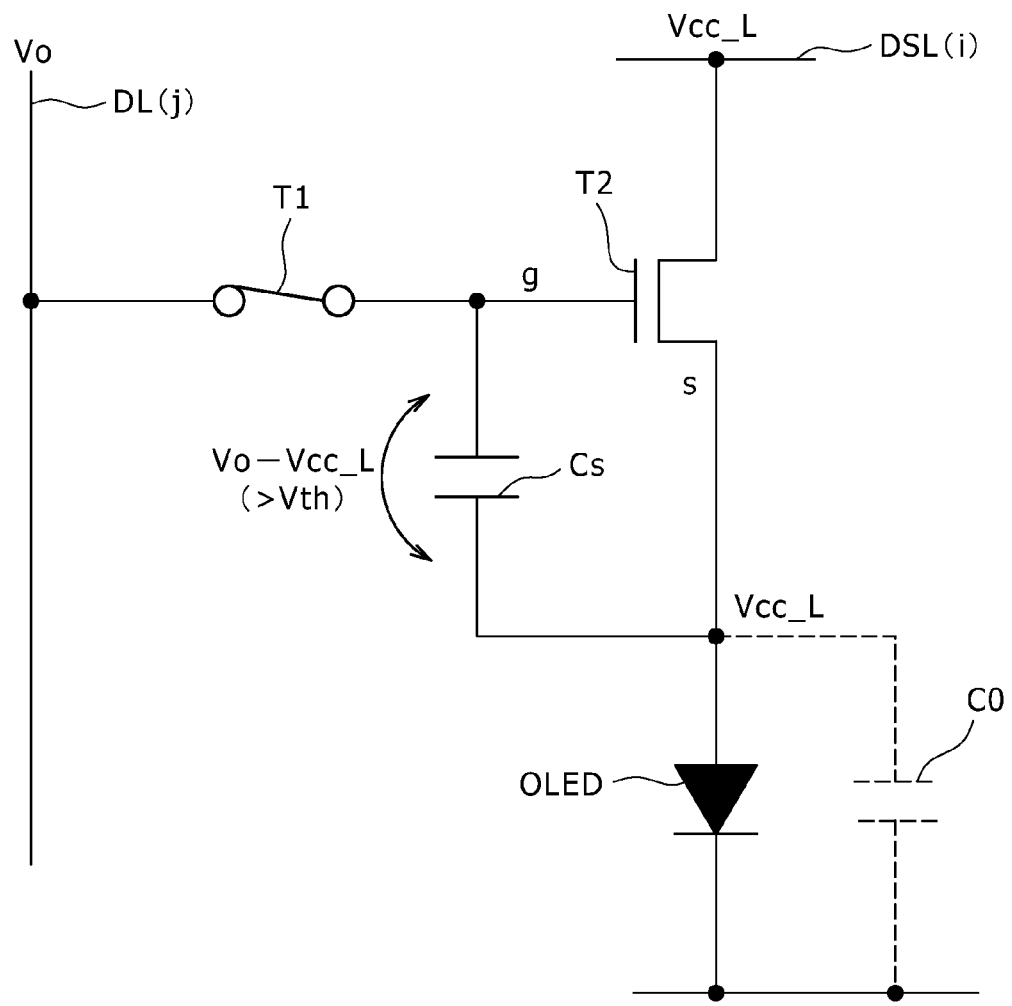
FIG. 6C is a circuit diagram illustrating a state in the pixel circuit corresponding to period (C) of FIG. 5.

FIG. 6C corresponds to an operation state of period (C) shown in FIG. 5. In period (C), the potential of scan line CSNL(i) changes to high. Consequently, the thin-film transistor T1 is turned on, upon which the gate potential Vg of the thin-film transistor T2 is set to the reference potential Vo for initialization applied to the signal line DL(j).

When period (C) ends, the hold voltage Vgs of the hold capacity Cs is initialized to a voltage greater than the threshold voltage Vth of the thin-film transistor T2. At this moment, a high potential is applied to the common power supply line to which the cathode electrode of the organic EL device OLED is connected, thereby reversely biasing the organic EL device OLED. Consequently, the drain current Ids flows to the signal line DL(j) through the hold capacity Cs and the thin-film transistor T1.

(iii) Threshold Correcting Operation

Figure 6D:
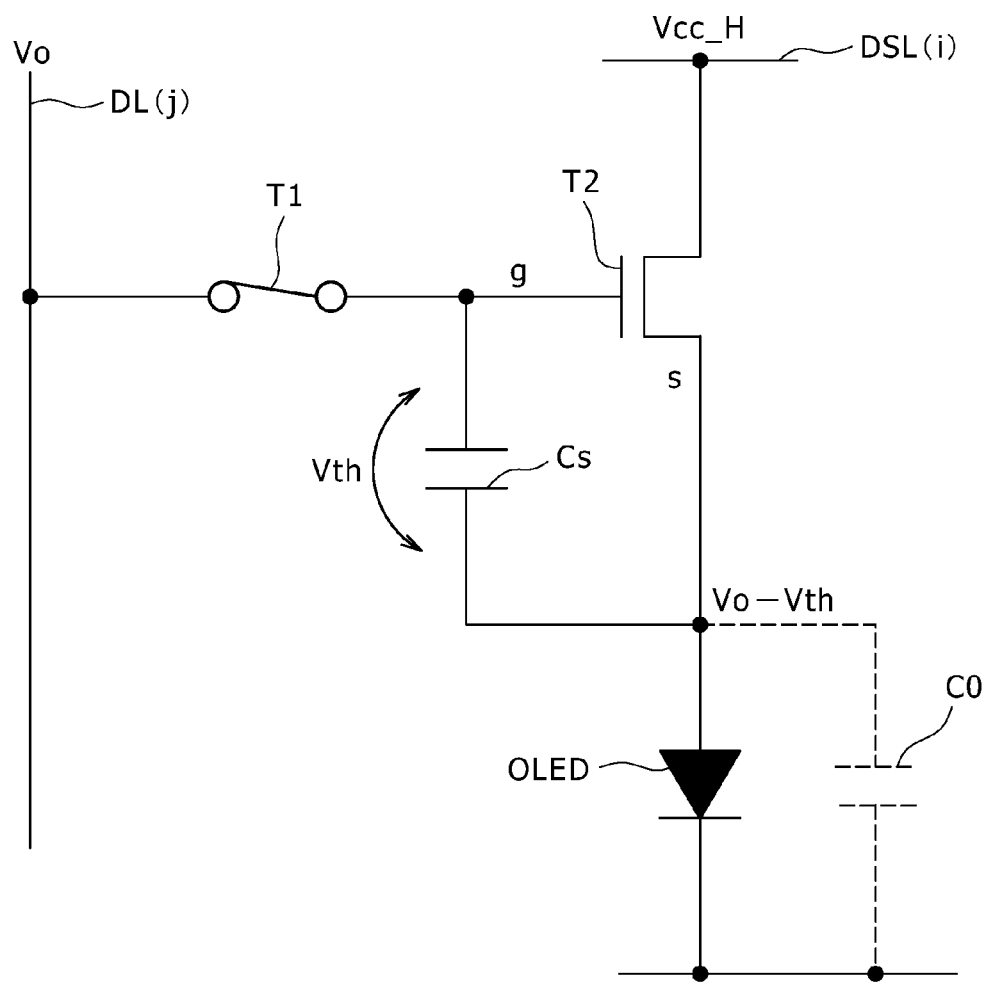
FIG. 6D is a circuit diagram illustrating a state in the pixel circuit corresponding to period (D) of FIG. 5.

FIG. 6D corresponds to an operation state of period (D) shown in FIG. 5. In period (D), the potential of the drive power supply line DSL(i) is switched from the low power supply potential Vcc_L for initialization to the high power supply potential Vcc_H for light emitting. It should be noted that the thin-film transistor T1 for sampling is maintained in the on state.

As a result, merely the source potential Vs starts rising with the gate potential Vg of the thin-film transistor T2 kept at the initializing reference potential Vo. At any point of time up to the end of period (D), the hold voltage Vgs of the hold capacity Cs reaches the threshold voltage Vth. Consequently, the thin-film transistor T2 turns off. The source potential Vs at this moment goes lower than the gate potential Vg (=Vo) by the threshold voltage Vth.

(iv) Preparing Operation for Signal Potential Write and Mobility Correction

Figure 6E:
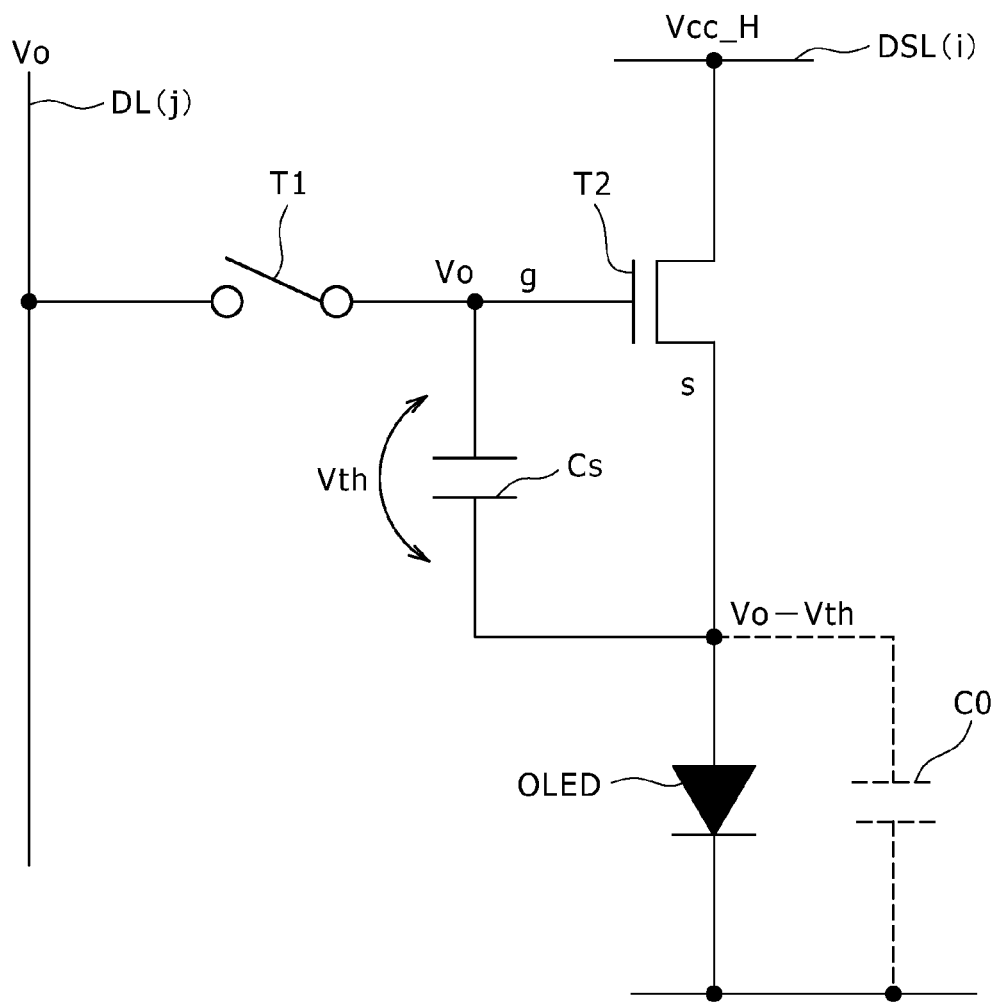
FIG. 6E is a circuit diagram illustrating a state in the pixel circuit corresponding to period (E) of FIG. 5.

FIG. 6E corresponds to an operation state of period (E) shown in FIG. 5. In Period (E), the potential of the scan line SCNL(i) changes to low. Consequently, the thin-film transistor T2 is turned off to put the gate electrode of the thin-film transistor T2 as a drive transistor into a floating state.

Figure 6F:
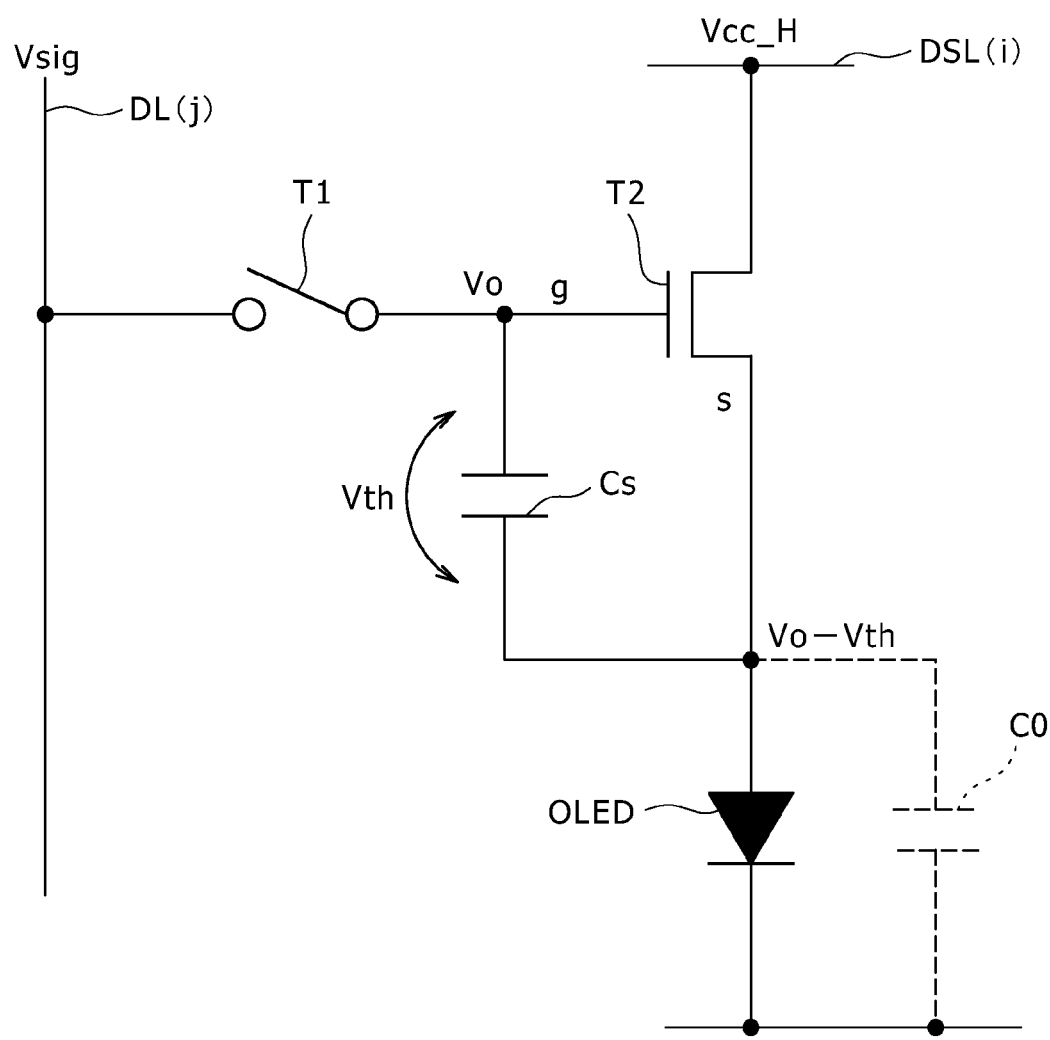
FIG. 6F is a circuit diagram illustrating a state in the pixel circuit corresponding to period (F) of FIG. 5.

However, the cutoff state of the thin-film transistor T2 is maintained. Therefore, the drain current Ids does not flow. FIG. 6F corresponds to an operation state of period (F) shown in FIG. 5. In period (F), the potential of signal line DL(j) changes from the initialization reference potential Vo to the data potential Vsig. It should be noted however that the thin-film transistor T1 that functions as a sampling transistor remains in the off state.

(v) Signal Potential Write and Mobility Correction

Figure 6G:
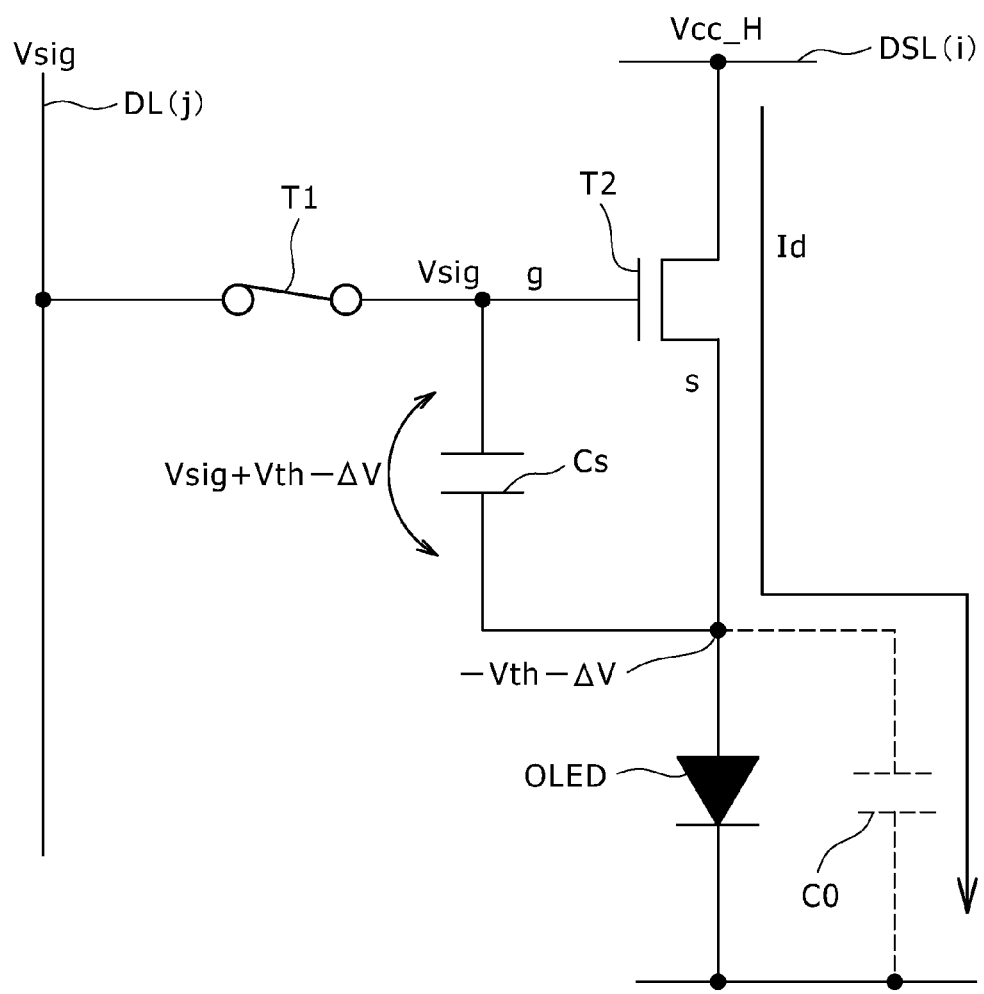
FIG. 6G is a circuit diagram illustrating a state in the pixel circuit corresponding to period (G) of FIG. 5.

FIG. 6G corresponds to an operation state of period (G). In period (G), the potential of scan line SCNL(i) changes to high. Consequently, the sampling transistor T1 is turned on, upon which the gate electrode of the thin-film transistor T2 goes to signal potential Vsig.

Also, in period (G), the power supply line DSL(i) changes to the light-emitting high power supply potential Vcc_H. As a result, the thin-film transistor T2 is turned on, upon which the drain current Ids flows. However, the organic EL device OLED is initially in the cutoff state (or the high impedance state). Hence, the drain current Ids flows not into the organic EL device OLED but into the parasitic capacity Cs as shown in FIG. 6G.

As the parasitic capacity Cs is charged, the source potential Vs of the thin-film transistor T2 starts rising. Then, the hold voltage Vgs of the hold capacity Cs goes Vsig+Vth−ΔV. Thus, the sampling of signal potential Vsig and the correction by charge voltage ΔV are executed in parallel. It should be noted that, as the data potential Vsig is larger, the drain current Ids gets larger, thereby making the absolute value of charge voltage ΔV larger.

Consequently, the mobility correction in accordance with any light-emitting level is made practicable. It should be noted that, if the signal potential Vsig is constant, as mobility μ of the thin-film transistor T2 is larger, the absolute value of charge voltage ΔV gets larger, thereby making a feedback larger.

(vi) Signal Potential Write and Mobility Correction

Figure 6H:
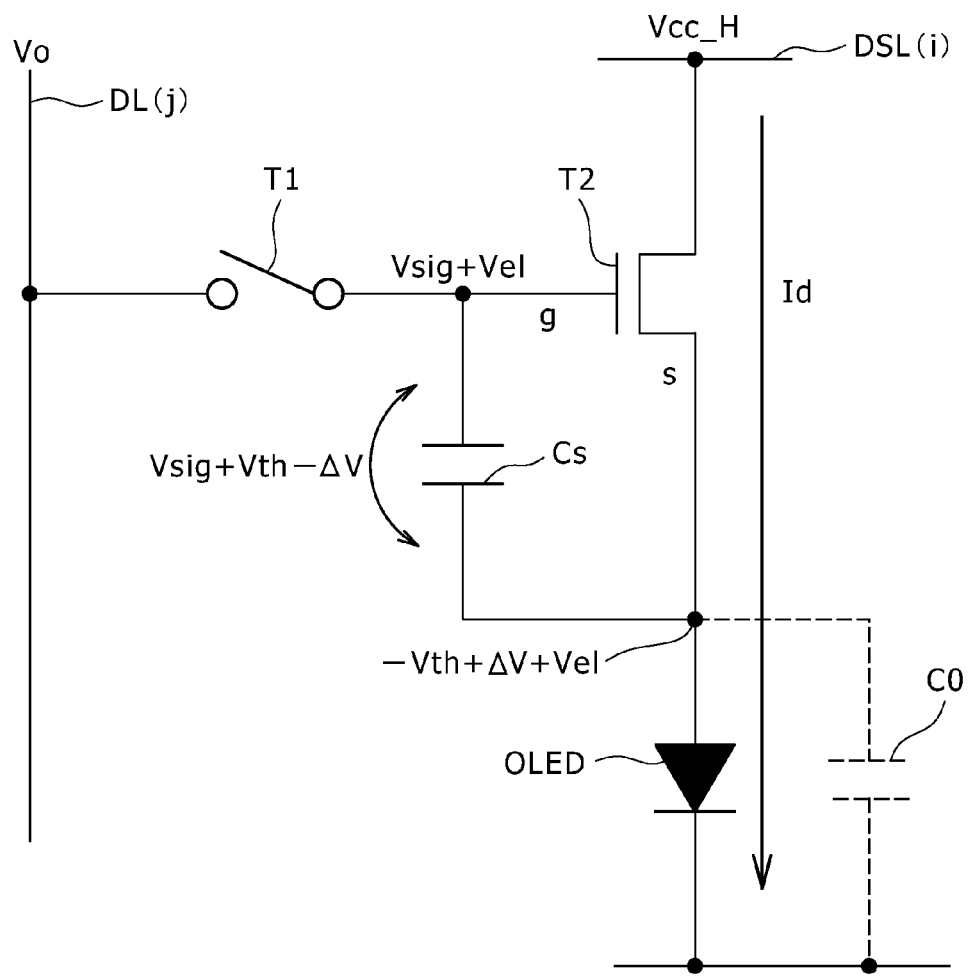
FIG. 6H is a circuit diagram illustrating a state in the pixel circuit corresponding to period (H) of FIG. 5.

FIG. 6H corresponds to an operation state of period (H) shown in FIG. 5. The potential of scan line SCNL(i) changes to low again. Consequently, the thin-film transistor T1 is turned off to put the gate electrode of the thin-film transistor T2 into a floating state.

It should be noted that the potential of the power supply line DSL(i) is maintained at the light-emitting high power supply potential Vcc_HH, so that the drain current Ids corresponding to the hold voltage Vgs (=Vsig+Vth−ΔV) of the hold capacity Cs is continuously supplied to the organic EL device OLED. This supply of the drain current causes the organic EL device OLED to start emitting light. At the same time, light-emitting voltage Vel corresponding to the magnitude of the drain current Ids occurs between both the electrodes of the organic EL device OLED.

Namely, the source voltage Vs of the thin-film transistor T2 rises. Also, a bootstrap operation of the hold capacity Cs1 causes the gate potential Vg to rise by the amount of rise of the source potential Vs. Consequently, the hold capacity Cs comes to hold the same hold voltage Vgs (=Vsig+Vth−ΔV) as that before the bootstrap operation. As a result, the light-emitting operation caused by the drain current Ids with the mobility corrected is continued.

(B-3) Correction Effect

Figure 7:
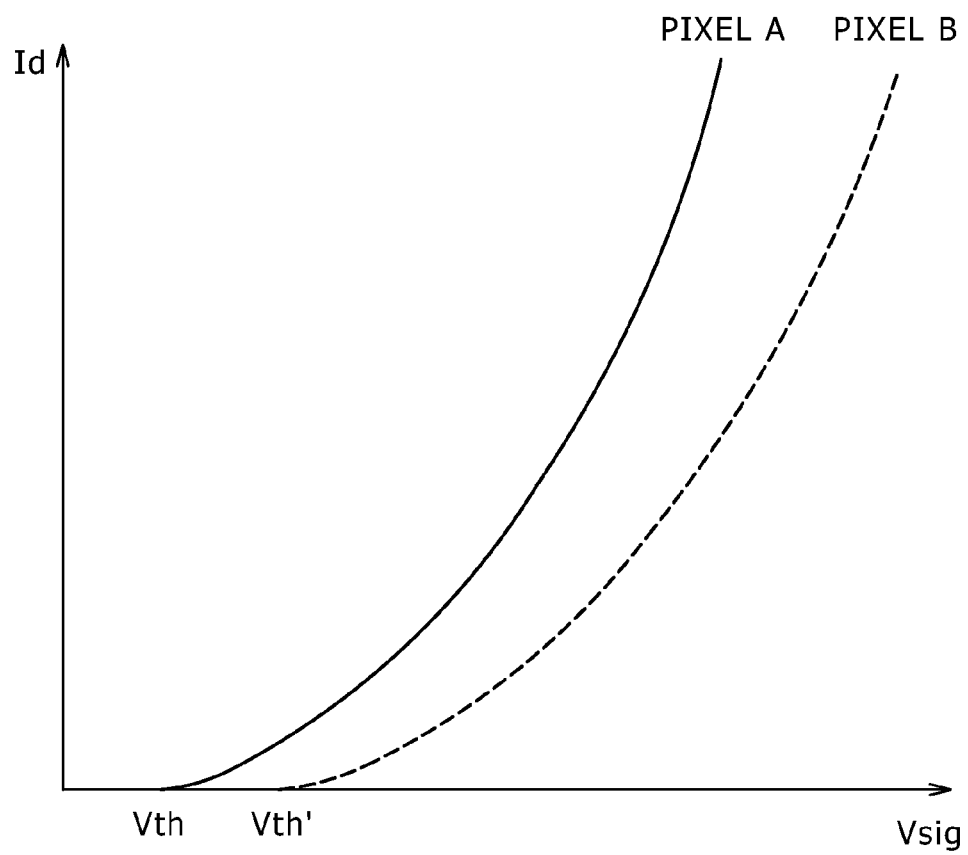
FIG. 7 is a graph indicative of a relationship of data voltage and drain current with none of threshold correction and mobility correction executed.

Here, the effect of correction is confirmed. FIG. 7 shows the current-voltage characteristic of the thin-film transistor T2. Especially, the drain current Ids at the time when the thin-film transistor T2 is operating in a saturation region is given by the following equation.

$$Ids = (1/2) \cdot \mu \cdot (W/L) \cdot Cox \cdot (Vgs - Vth)^2 \quad (1)$$

In the above-mentioned relation, μ is representative of mobility. W is representative of gate width. L is representative of gate length. Cox is representative of gate oxide film capacitance per unit area. As seen from the above-mentioned transistor characteristics relation, when the threshold voltage Vth fluctuates, the drain current Ids fluctuates if the hold voltage Vgs is constant. FIG. 7 shows a relationship between the data voltage Vsig and the drain current Ids at a time when neither threshold correction nor mobility correction is executed.

In the case of the above-mentioned example of correcting operation, however, the hold voltage Vgs at the time of light emission is given by Vsig+Vth−ΔV. Therefore, the equation (1) above can be represented as follows.

$$Ids = (1/2) \cdot \mu \cdot (W/L) \cdot Cox \cdot (Vsig - \Delta V)^2 \quad (2)$$

As seen from equation (2), threshold voltage Vth is deleted from the equation. Namely, it is understood that the dependence on the threshold voltage Vth was removed by the above-mentioned correcting operation.

Figure 8:
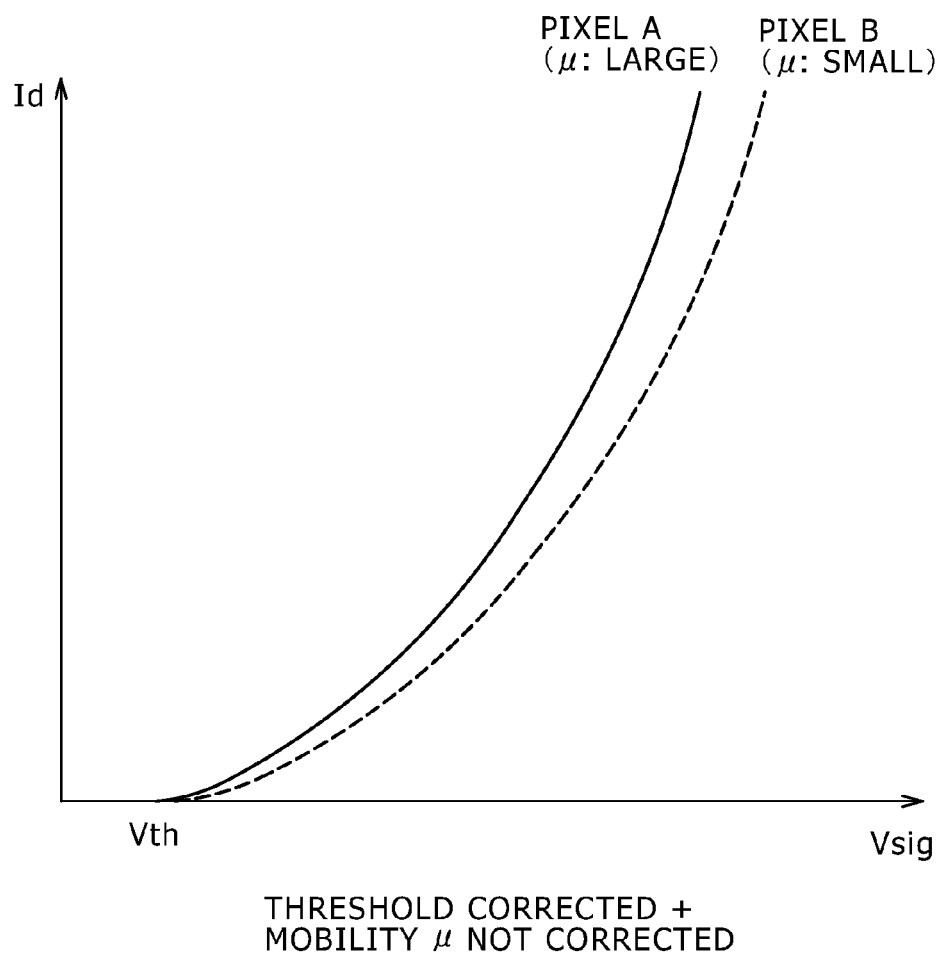
FIG. 8 is a graph indicative of a relationship of data voltage and drain current with merely threshold correction executed.

This denotes that, if there exist a variation in the threshold voltage Vth of the thin-film transistor T2 that constitutes the pixel circuit 1, such a variation will not affect the drain current Ids. FIG. 8 shows a relation between the data voltage Vsig and the drain current Ids at a time when merely the threshold correction is executed.

It should be noted that, with pixels having different motilities μ, the drain currents Ids thereof will take different values if the data voltage Vsig is the same. In the case of FIG. 8, pixel A is greater in mobility μ than pixel B. Hence, if the data voltage Vsig is the same, the drain current Ids of pixel A is greater than the drain current Ids of pixel B. However, the charge voltage ΔV occurring in the parasitic capacity C0 in the same correction period depends on mobility μ.

Figure 9:
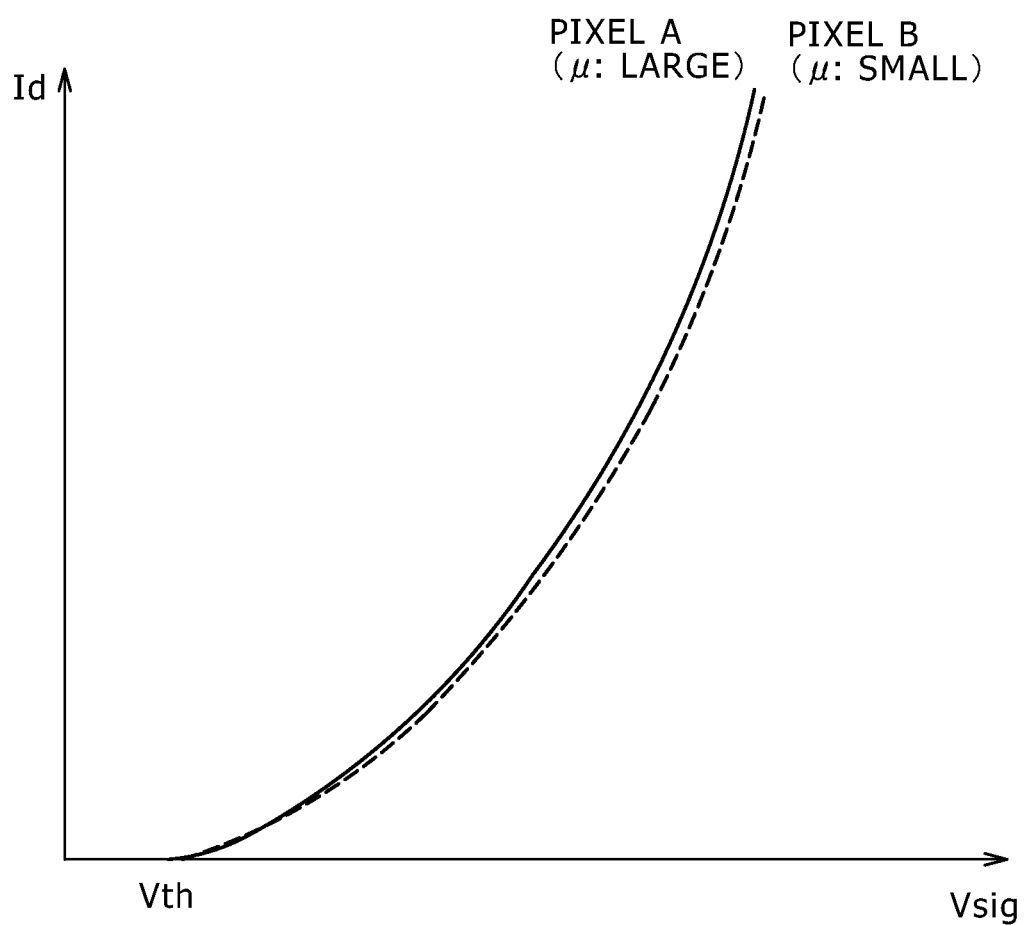
FIG. 9 is a graph indicative of a relationship of data voltage and drain current with both threshold correction and mobility correction executed.

Namely, the charge voltage ΔV of the pixel having greater mobility μ is greater than the charge voltage ΔV of the pixel having smaller mobility μ. In equation (2) above, the charge voltage ΔV acts on the direction in which the drain current Ids lowers. As a result, the effect of the variation in the mobility μ appearing in the drain current Ids is suppressed. Namely, as shown in FIG. 9, the same drain current Ids can flow to any data current Vsig.

(D) Layout Pattern Examples (D-1) Pattern Example 1

Figure 1:
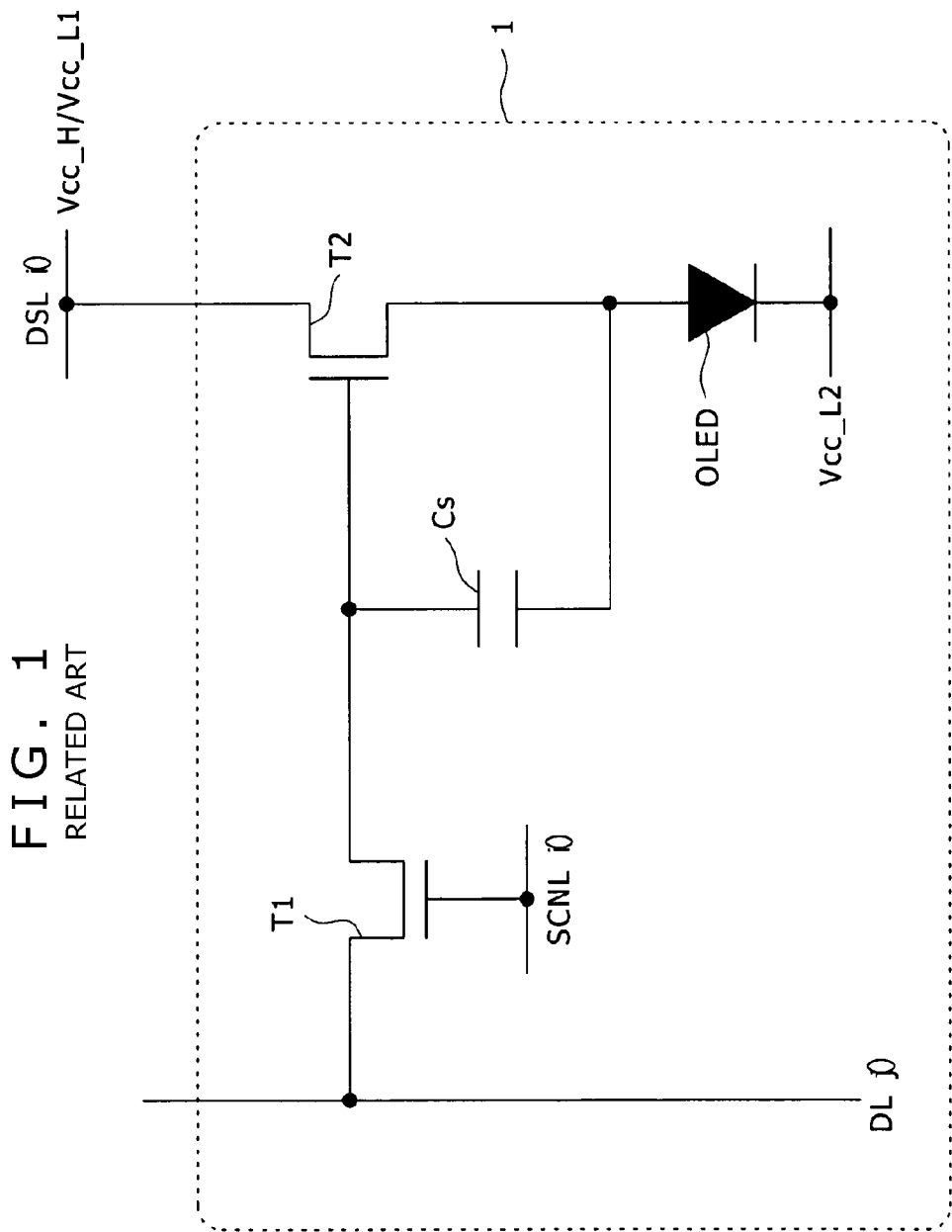
FIG. 1 is a circuit diagram illustrating an exemplary pixel circuit.

The following describes a layout pattern of the high-potential power supply line 11 that is suitable when a pixel array block is made up of the pixel circuit 1 having the configuration shown in FIG. 1.

Figure 10:
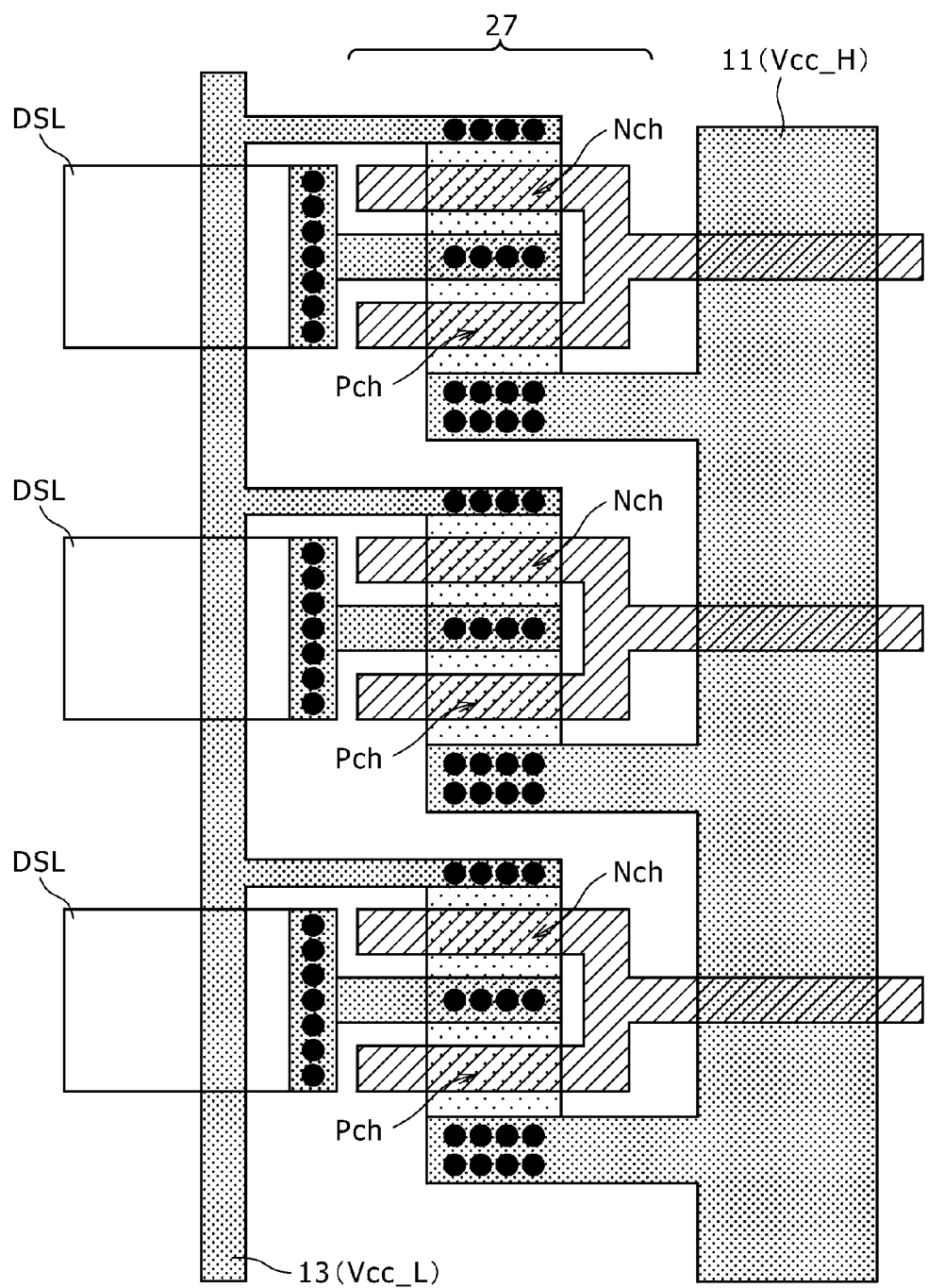
FIG. 10 is a schematic diagram illustrating a layout pattern corresponding to pattern example 1.

FIG. 10 shows a layout pattern that is proposed as the pattern example 1. In this pattern example, the low-potential power supply line 13 that is not desired to increase the wiring width thereof is arranged on the valid pixel area side so as to cross the drive power supply line DSL(i). On the other hand, the high-potential power supply line 11 that is desired to increase the wiring width thereof is arranged so as to cross the output wiring of the preceding buffer circuit that constitutes the power supply line drive circuit 27.

In pattern example 1, the waveform of power supply drive pulse may also remain blunt due to the parasitic capacitance at the cross between the high-potential power supply line 11 thick in wiring width and the output wiring of the preceding buffer circuit. However, if the waveform of the supply line drive pulse is made blunt, the blunt waveform can be reshaped in the subsequent output buffer circuit. Therefore, the driving of the drive power supply line DSL(i) will not be affected.

Also, use of a positional relation in which there is no cross between the high-potential power supply line 11 and the drive power supply line DSL(i) can make smaller the cross area between wirings that may generate a large potential alternately. This configuration can minimize the possibility of causing a inter-layer short circuit due to dust or the like, thereby significantly improving the yield of the production of organic EL panels.

(D-2) Pattern Example 2

The following also describes a layout pattern example of the high-potential power supply line 11 that is suitable when a pixel array block is made up by the pixel circuit 1 having the configuration shown in FIG. 1.

Figure 11:
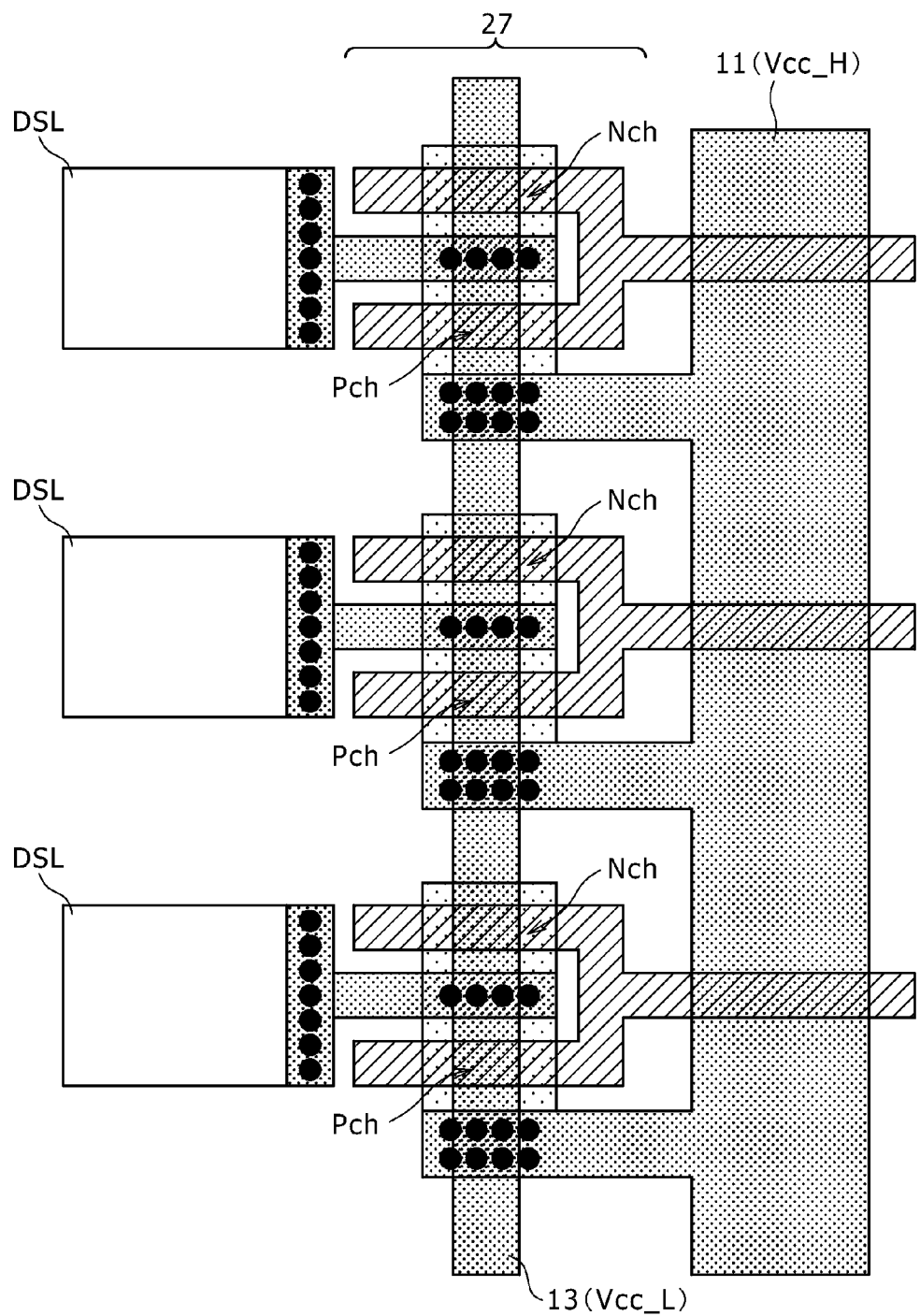
FIG. 11 is a schematic diagram illustrating a layout pattern corresponding to pattern example 2.

FIG. 11 shows a layout pattern proposed as the pattern example 2. The pattern example 2 is a variation of the pattern example 1. Namely, merely the positional arrangement of the low-potential power supply line 13 that need not be increased in wiring width is changed in the pattern example 2.

In the case of the pattern example 2, the low-potential power supply line 13 and the drive power supply line DSL(i) are arranged so as not to cross each other. To be more specific, the low-potential power supply line 13 is arranged so as to overlap the output buffer of the power supply line drive circuit 27.

In this wiring example, the number of layers increases from 2 to 3; however, the cross portion between the digitally driven power supply line DSL(i) and the low-potential power supply line 13 can be eliminated. As a result, this configuration can still decrease the possibility of an inter-layer short circuit due to dust or the like, thereby still significantly improving the yield of the production of organic EL panels.

(D-3) Pattern Example 3

The following also describes a layout pattern example of the high-potential power supply line 11 that is suitable when a pixel array block is made up by the pixel circuit 1 having the configuration shown in FIG. 1.

Figure 12:
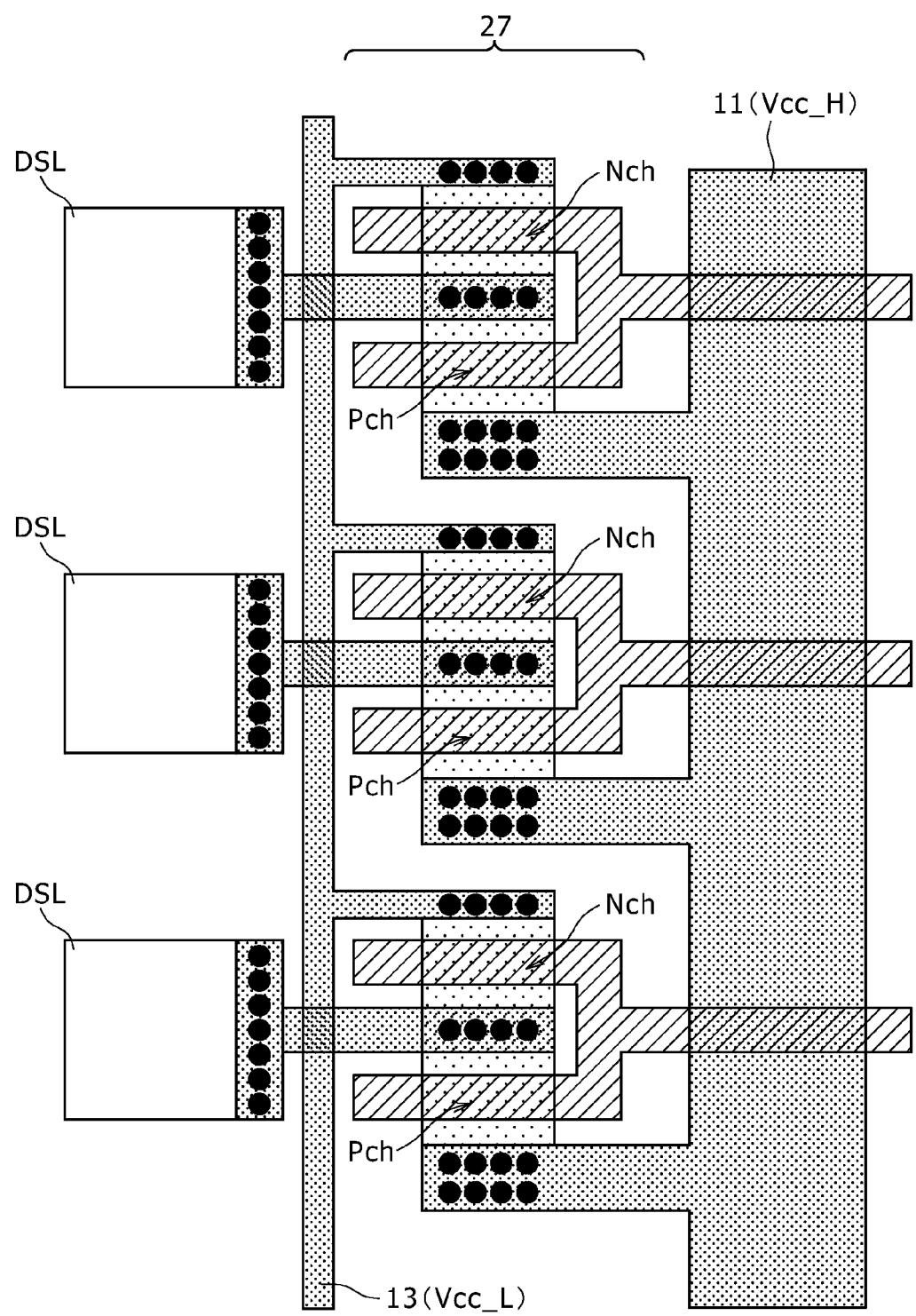
FIG. 12 is a schematic diagram illustrating a layout pattern corresponding to pattern example 3.

FIG. 12 shows a layout pattern proposed as the pattern example 3. The pattern example 3 is another variation of the pattern example 1. Namely, merely the positional arrangement of the low-potential power supply line 13 not desired to increase the wiring width thereof is changed.

In the case of pattern example 3, the low-potential power supply line 13 is arranged so as not to cross the drive power supply line DSL(i). To be more specific, the low-potential power supply line 13 is arranged at an intermediate position between the output buffer circuit of the power supply line drive circuit 27 and the drive power supply line DSL(i). Namely, the low-potential power supply line 13 is arranged so as to cross an extraction wire for connecting the output terminal of the output buffer circuit with the drive power supply line DSL(i).

In this wiring example, the low-potential power supply line 13 crosses the digitally driven wiring (the extraction wire); however, the cross area is also small because this extraction wire is small in wiring width. As a result, this configuration can still further decrease the possibility of an inter-layer short circuit due to dust or the like, thereby still further significantly improving the yield of the production of organic EL panels.

(D-4) Pattern Example 4

The following also describes a layout pattern example of the high-potential power supply line 11 that is suitable when a pixel array block is made up by the pixel circuit 1 having the configuration shown in FIG. 1.

Figure 13:
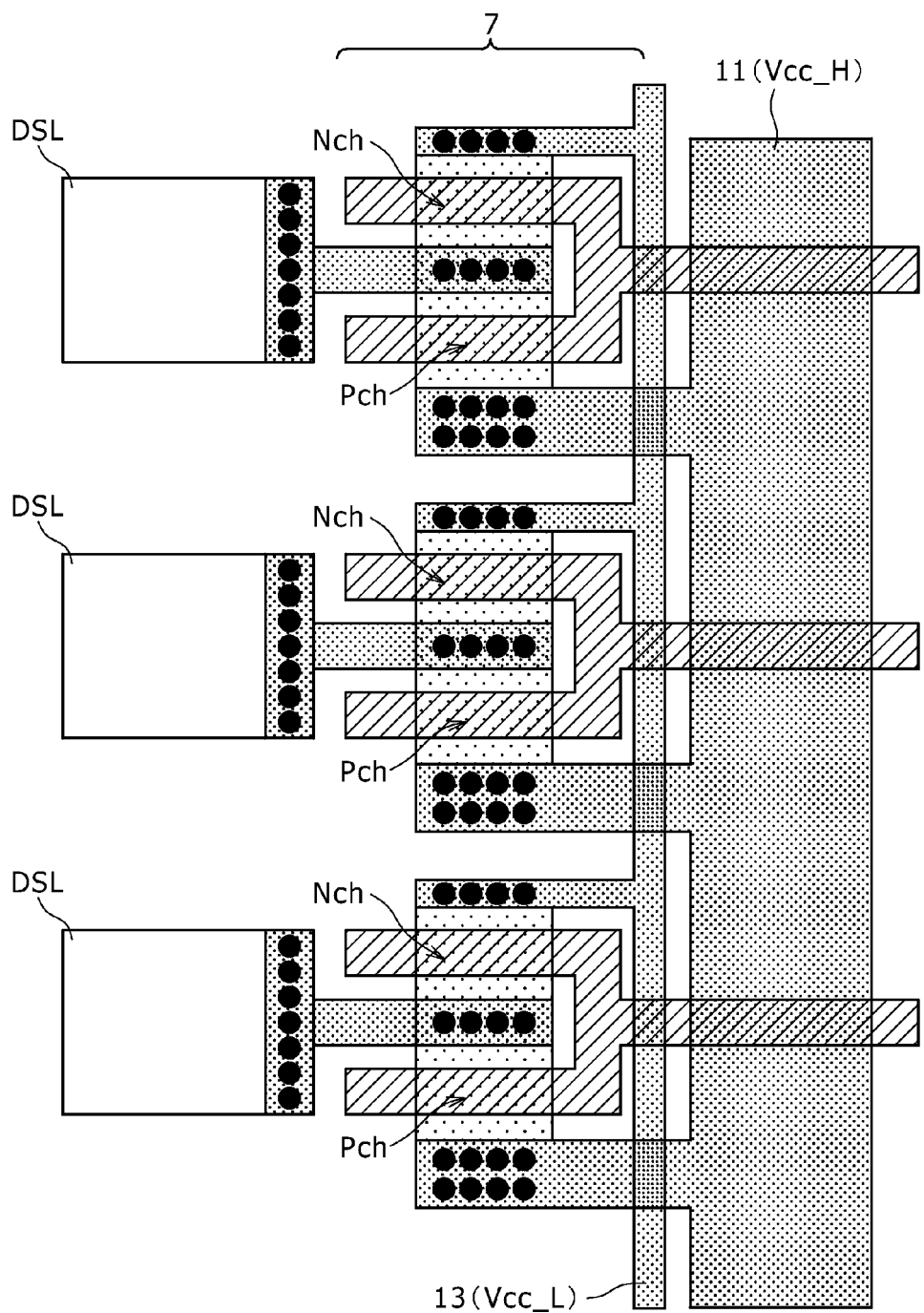
FIG. 13 is a schematic diagram illustrating a layout pattern corresponding to pattern example 4.

FIG. 13 shows a layout pattern proposed as the pattern example 4. The pattern example 4 is still another variation of the pattern example 1. Namely, merely the positional arrangement of the low-potential power supply line 13 not desired to increase the wiring width thereof is changed.

In the case of the pattern example 4, the low-potential power supply line 13 is arranged so as not to cross the drive power supply line DSL(i). To be more specific, the low-potential power supply line 13 is arranged at an intermediate position between the output buffer circuit of the power supply line drive circuit 27 and the high-potential power supply line 11(i).

In this wiring example, like the case of the high-potential power supply line 11 thick in wiring width, the waveform of power supply drive pulse may also remain blunt due to the parasitic capacitance at the cross between the low-potential power supply line 13 and the output wiring of the preceding buffer circuit.

However, because the wiring width of the low-potential power supply line 13 is small and the parasitic capacity is low, and, if the waveform get blunt, the blunt waveform can be reshaped, thereby involving no problem in operation. Obviously, in this case can also improve the yield of the production of organic EL panels.

(D-5) Pattern Example 5

The following also describes a layout pattern example of the high-potential power supply line 11 that is suitable when a pixel array block is made up by the pixel circuit 1 having the configuration shown in FIG. 1.

Figure 14:
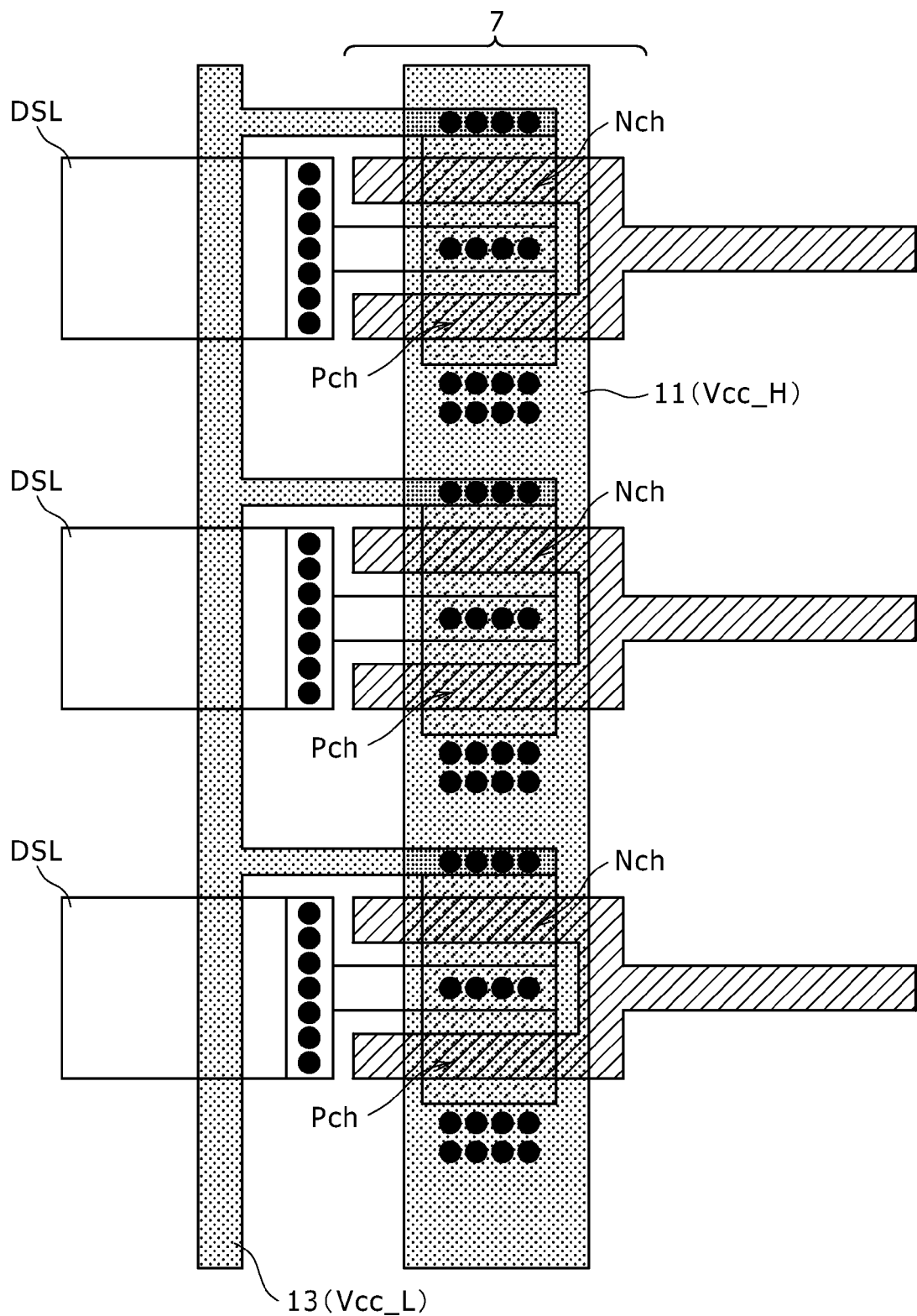
FIG. 14 is a schematic diagram illustrating a layout pattern corresponding to pattern example 5.

FIG. 14 shows a layout pattern proposed as the pattern example 5. The pattern example 5 is yet another variation of the pattern example 1. Namely, merely the positional arrangement of the high-potential power supply line 11 is changed.

To be more specific, the high-potential power supply line 11 is arranged so as to overlap the output buffer circuit of the power supply line drive circuit 27.

In this wiring example, the number of wiring layers increases from 2 to 3; however, the cross portion between the digitally driven power supply line DSL(i) and the low-potential power supply line 13 can be eliminated. As a result, this configuration can still decrease the possibility of an inter-layer short circuit due to dust or the like, thereby still significantly improving the yield of the production of organic EL panels.

(D-6) Pattern Example 6

The following also describes a layout pattern example of the high-potential power supply line 11 that is suitable when a pixel array block is made up by the pixel circuit 1 having the configuration shown in FIG. 1.

Figure 15:
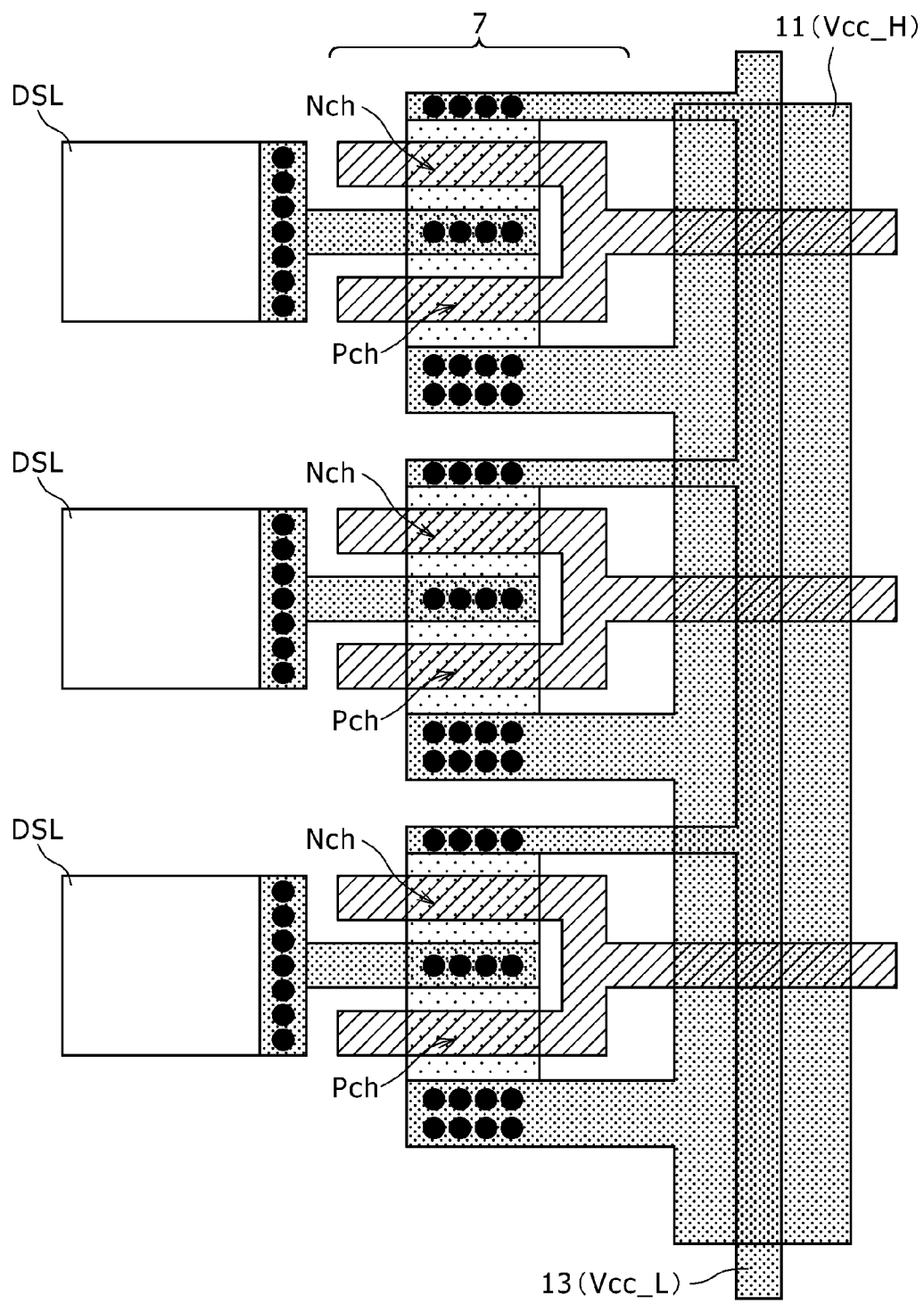
FIG. 15 is a schematic diagram illustrating a layout pattern corresponding to pattern example 6.

FIG. 15 shows a layout pattern proposed as the pattern example 6. The pattern example 6 is a different variation of the pattern example 1. To be more specific, the low-potential power supply line 13 is arranged so as to overlap the high-potential power supply line 11 arranged in front of the output buffer circuit of the power supply line drive circuit 27.

In this wiring example, a high voltage is applied between the power supply lines; however, this high voltage is a static voltage, so that an effect of the waveform to the operation of the drive power supply line DSL(i) need not be considered. In addition, because the power supply line need not be offset-arranged on the plane, the area of the organic EL panel can be reduced if slightly.

(D-7) Pattern Example 7

The following also describes a layout pattern example of the high-potential power supply line 11 that is suitable when a pixel array block is made up by the pixel circuit 1 having the configuration shown in FIG. 1.

Figure 16:
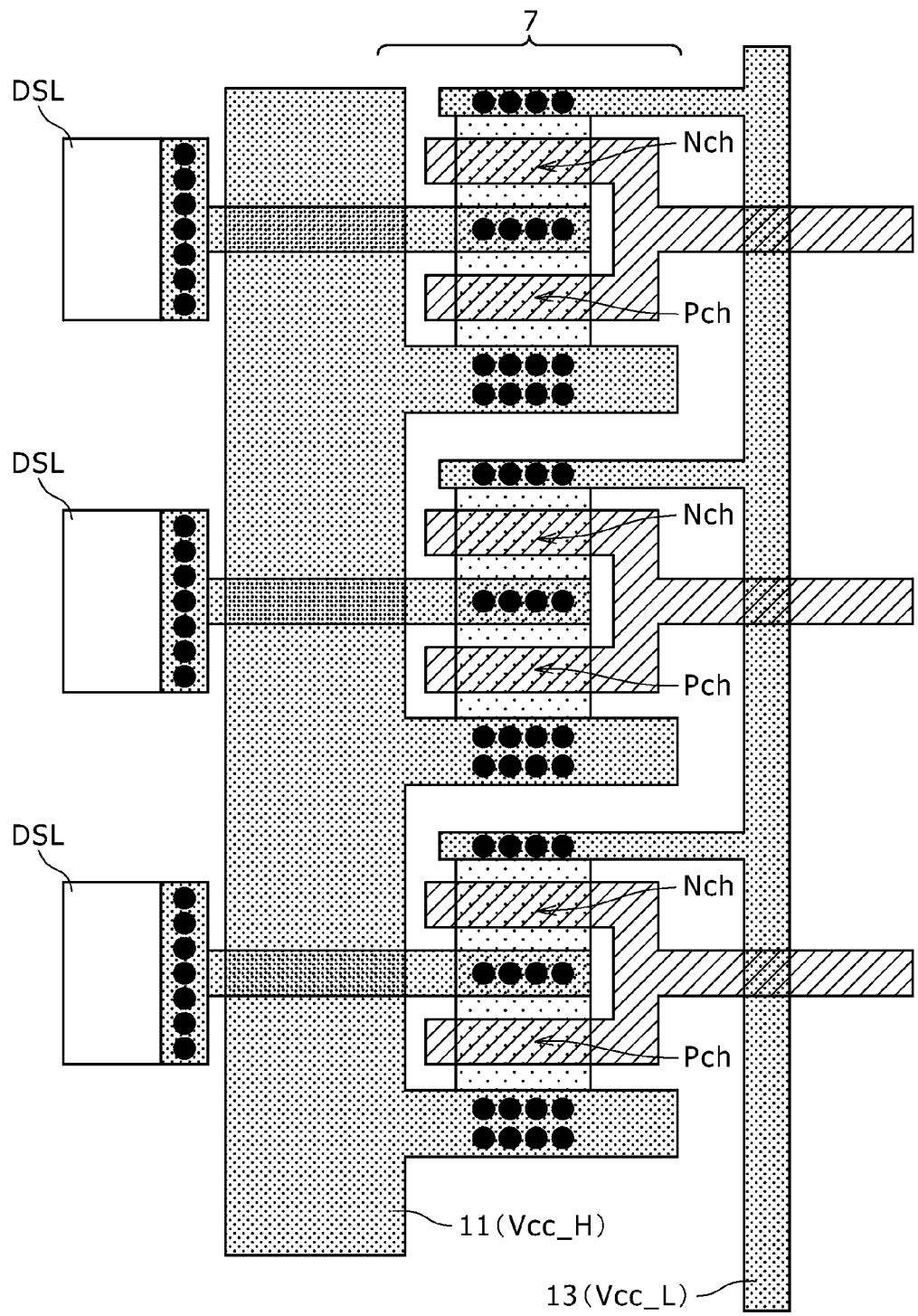
FIG. 16 is a schematic diagram illustrating a layout pattern corresponding to pattern example 7.

FIG. 16 shows a layout pattern proposed as the pattern example 7. In the pattern example 7, the high-potential power supply line 11 and the low-potential power supply line 13 are arranged in a manner opposite to the pattern example 1. However, if the high-potential power supply line 11 crosses the drive power supply line DSL(i), the above-mentioned technical problems may not be solved.

Therefore, the extraction wire connected the output terminal of the output buffer circuit of the power supply line drive circuit 27 to the drive power supply line DSL(i) is elongated so as to be crossed with the high-potential power supply line 11.

In this wiring example, the high-potential power supply line 11 crosses the digitally driven wiring (namely, the extraction wire); however, the cross area is also small because this extraction wire is small in wiring width. As a result, this configuration can still further decrease the possibility of an inter-layer short circuit due to dust or the like, thereby still further significantly improving the yield of the production of organic EL panels.

(D-8) Pattern Example 8

Figure 17:
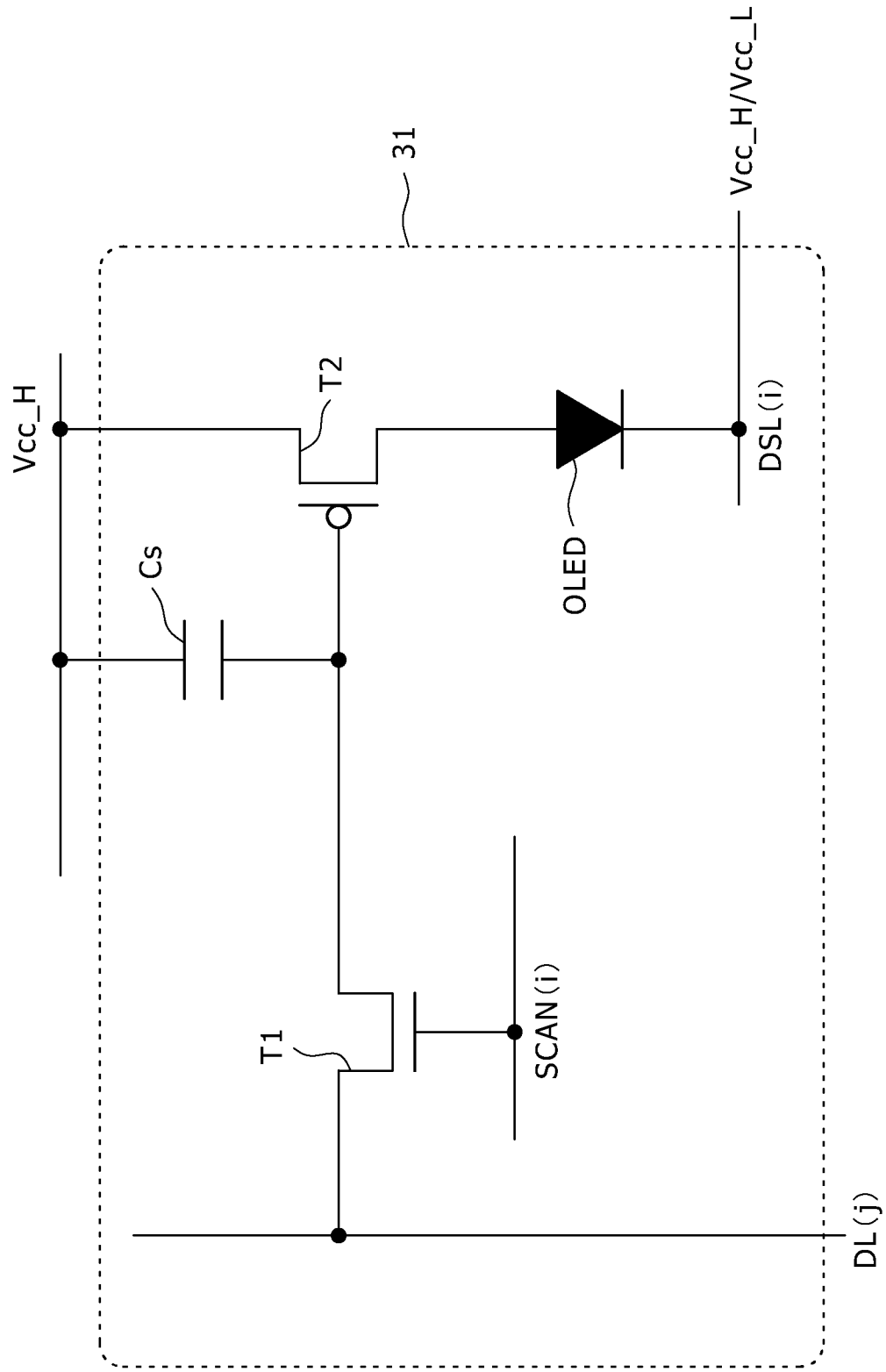
FIG. 17 is a circuit diagram illustrating another exemplary pixel circuit.

The following describes a layout pattern example of the high-potential power supply line 11 and the low-potential power supply line 13 that is suitable when the pixel array block is constituted by a pixel circuit 31 having the configuration shown in FIG. 17. The pixel circuit 31 in this example is made up of the thin-film transistor T2 with the drive transistor is of p type. Accordingly, the other electrode of the hold capacity Cs is connected to the common power supply line that supplies high power supply potential Vcc_H to all pixels.

It should be noted that, in the case of FIG. 17, the drive power supply line DSL(i) corresponds to a power supply line to which the cathode electrode of the organic EL device OLED is connected. Therefore, in the case of FIG. 17, the operation in the pixel circuit 31 is controlled by digitally driving the drive power supply line DSL(i) to which the cathode electrode is connected.

Obviously, in this case too, the common signal line to which high power supply potential Vcc_H is applied is relatively large in wire width in preparation for the supply of a large current. Also, the signal width of the drive power supply line DSL(i) is large to cope with the drawing of a large current.

Figure 18:
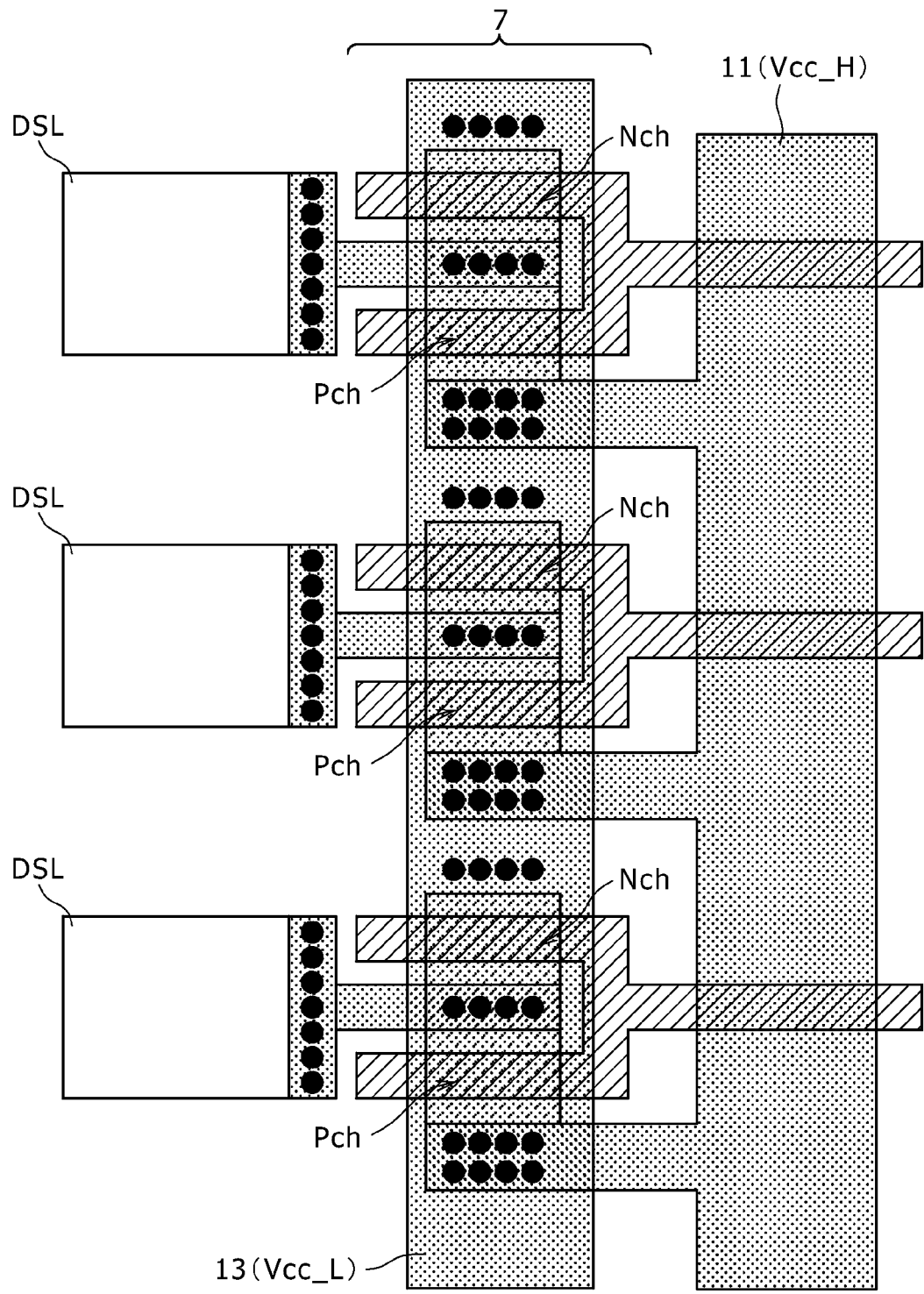
FIG. 18 is a schematic diagram illustrating a layout pattern corresponding to pattern example 8.

FIG. 18 shows a layout pattern proposed as the pattern example 8. In the pattern example 8, not merely the high-potential power supply line 11 but also the low-potential power supply line 13 have to have a relatively thick wiring width, so that these power supply lines have to be arranged so as not to cross the drive power supply line DSL(i).

Namely, in the case of FIG. 18, the high-potential power supply line 11 is arranged so as to be crossed with the output wiring of the preceding buffer circuit constituting of the power supply line drive circuit 27, while the low-potential power supply line 13 is arranged so as to be overlapped on the top layer of the preceding buffer circuit constituting the power supply line drive circuit 27. This arrangement minimizes the possibility of a short circuit due to dust or the like, thereby significantly improving the yield of the production of organic EL panels.

(D-9) Pattern Example 9

The following describes a layout pattern example of the high-potential power supply line 11 and the low-potential power supply line 13 that is suitable when the pixel array block is constituted by the pixel circuit 31 having the configuration shown in FIG. 17.

Figure 19:
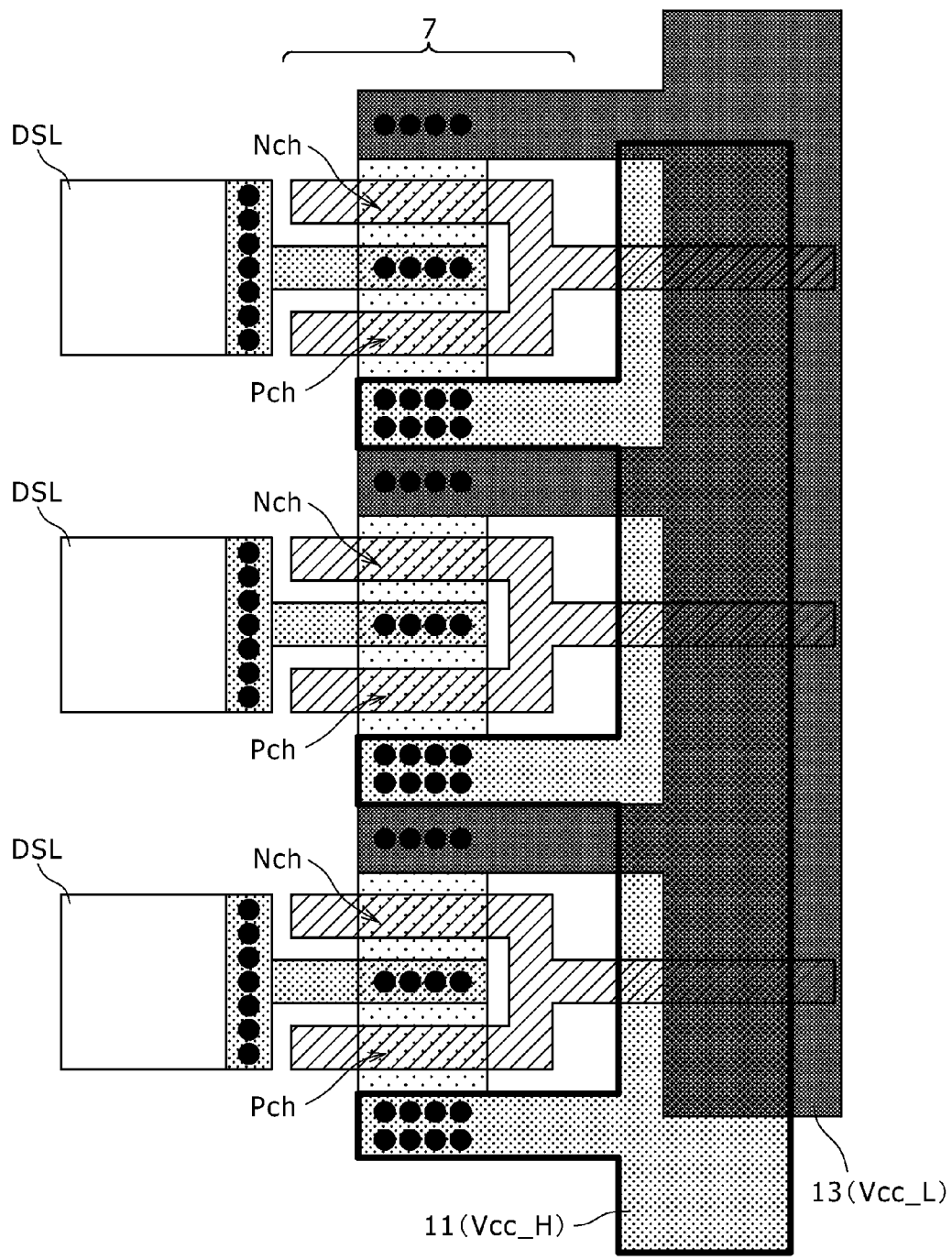
FIG. 19 is a schematic diagram illustrating a layout pattern corresponding to pattern example 9.

FIG. 19 shows a layout pattern proposed as the pattern example 9. In the pattern example 9, the high-potential power supply line 11 and the low-potential power supply line 13 are arranged so as to be overlapped with each other at a preceding position of the output buffer of the power supply line drive circuit 27. Either of these power supply lines may be the other in overlapping. It should be noted that, in this case, a parasitic capacity is generated at the portion in which the power supply lines having thick wire width overlap with each other. However, this parasitic capacity will not affect the power supply drive pulse because these power supply lines supply fixed potentials.

(D-10) Pattern Example 10

The following describes a layout pattern example of the high-potential power supply line 11 and the low-potential power supply line 13 that is suitable when the pixel array block is constituted by the pixel circuit 31 having the configuration shown in FIG. 17.

Figure 20:
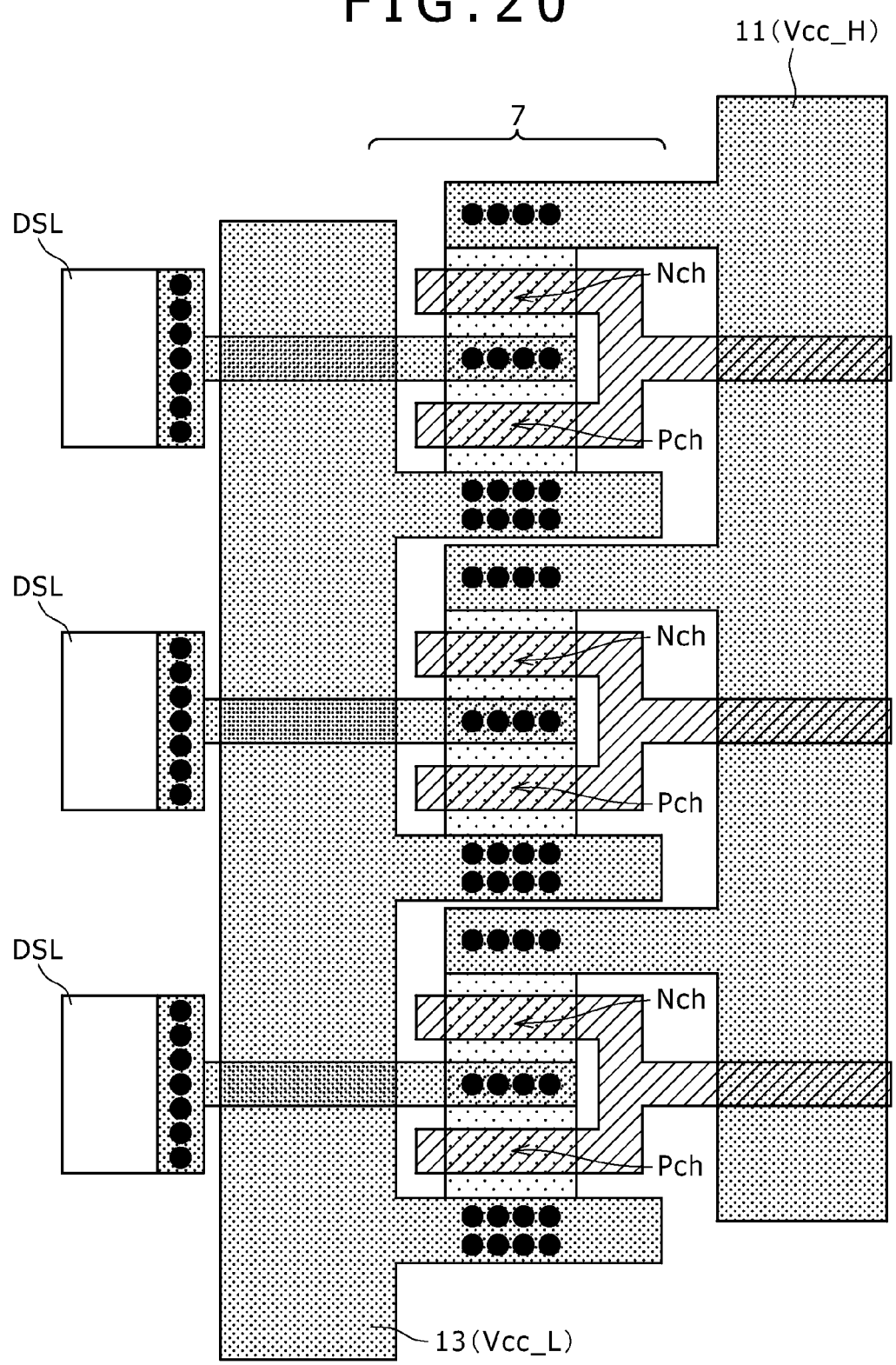
FIG. 20 is a schematic diagram illustrating a layout pattern corresponding to pattern example 10.

FIG. 20 shows a layout pattern proposed as the pattern example 10. In the pattern example 10, the high-potential power supply line 11 is arranged in front of the output buffer of the power supply line drive circuit 27 and the low-potential power supply line 13 is arranged so as to be crossed with the extraction wire connecting the output buffer of the power supply line drive circuit 27 to the drive power supply line DSL(i).

It should be noted that the positions of the high-potential power supply line 11 and the low-potential power supply line 13 may be replaced with each other. In this wiring example too, the cross area between the drive power supply line DSL(i) and the power supply line can be made small. Therefore, this arrangement minimizes the possibility of short circuit due to dust or the like, thereby significantly improving the yield of the production of organic EL panels.

(D-11) Others

It should be noted that the above-mentioned layout patterns are illustrative and therefore it is practicable to use other layouts.

(E) Other Embodiments (E-1) Product Examples (a) Drive IC

In the above, embodiments in which the pixel array block and the drive circuit are formed on one panel. It is also practicable to manufacture the scan line drive circuits 25, the power supply line drive circuit 27, and the data line drive circuit 29 separately from the pixel array block 23 and separately distribute organic EL panels formed with the pixel array block 23. For example, these drive circuits may be manufactured as drive ICs (Integrated Circuits) to be mounted on each organic EL panel formed with the pixel array block 23.

(b) Display Module

Figure 21:
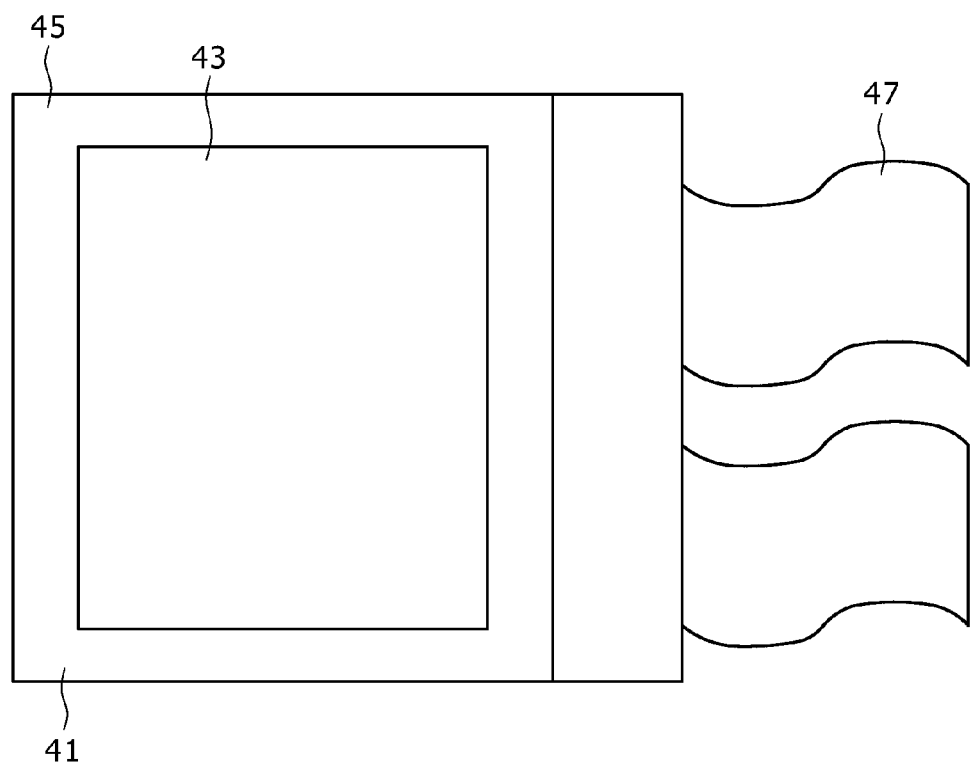
FIG. 21 is a schematic diagram illustrating an exemplary configuration of a display module.

The organic EL panel 21 in the above-mentioned embodiments may also be distributed in the form of a display module 41 having an external view shown in FIG. 21.

The display module 41 has a construction in which an opposite block 43 is laminated on the surface of a support base 45. With the opposite block 43, a color filter, a protection film, and a light-resistant film are arranged on the surface of a base that is made of glass or another transparent material.

It should be noted that the display module 41 may have an FPC (Flexible Printed Circuit) 47 or the like for interfacing between the outside and the support base 45.

(c) Electronic Devices

Figure 22:
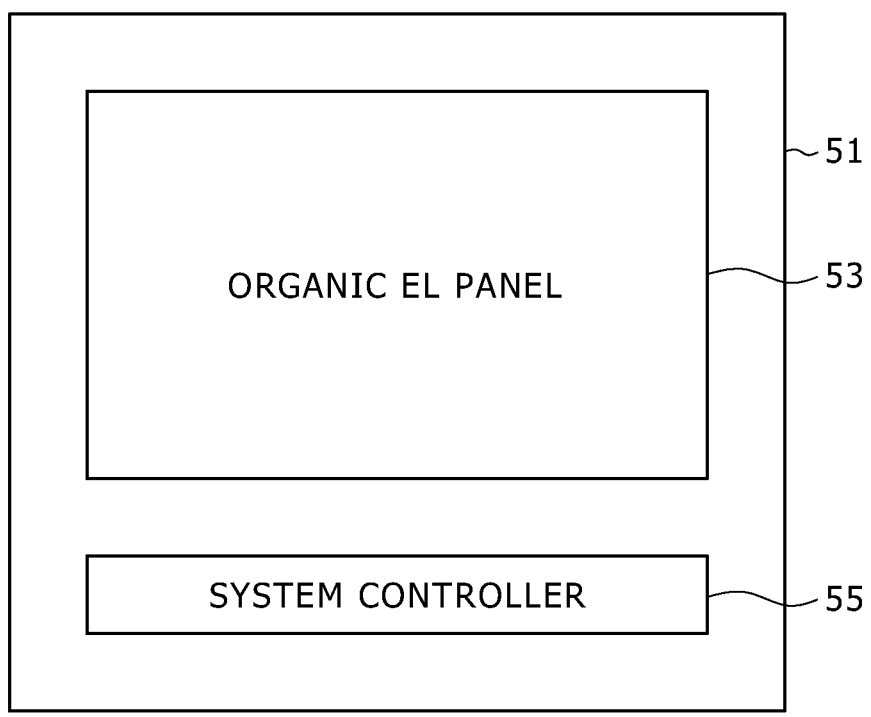
FIG. 22 is a schematic diagram illustrating an exemplary functional configuration of electronic equipment.

The organic EL panels in the above-mentioned embodiments may be distributed in the form of a product mounted on electronic devices. FIG. 22 shows a conceptual configuration example of an electronic device 51. The electronic device 51 is made up of an organic EL panel 53 and a system control block 55. Contents of processing to be executed by the system control block 55 depend on the product form of the electronic device 51.

Figure 23:
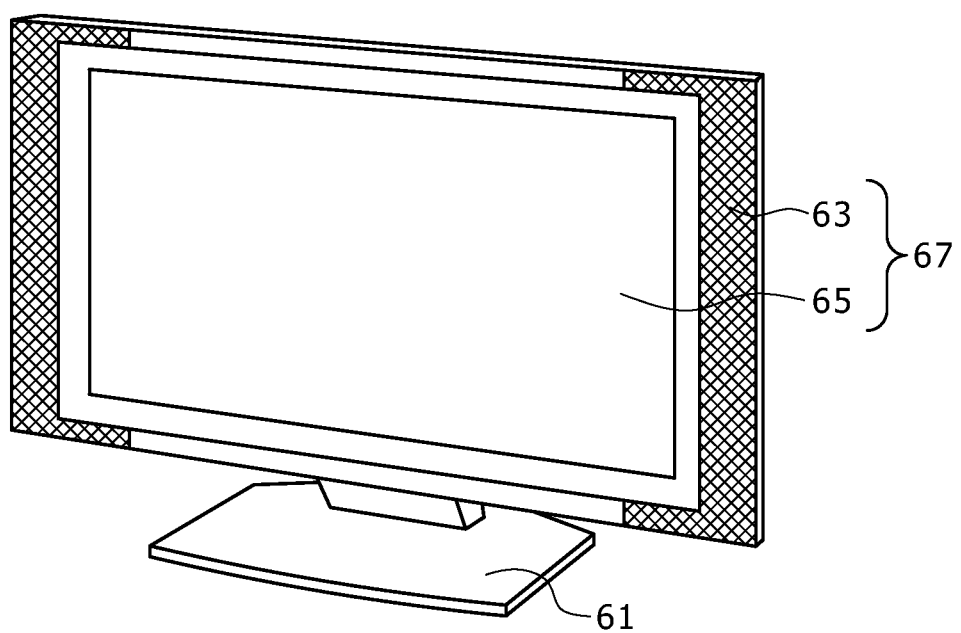
FIG. 23 is a schematic diagram illustrating an exemplary electronic equipment product.

It should be noted that the electronic device 51 is not limited to devices of a particular field as long as the electronic device 51 has capabilities of displaying images or video that generated inside the electronic device 51 or supplied from the outside. For the electronic device 51 of this type, a television receiver is assumed, for example. FIG. 23 shows an exemplary external view of a television receiver 61.

On the front side of a housing of the television receiver 61, a display screen 67 made up of a front panel 63 and a filter glass 65 is arranged. The portion of the display screen 67 corresponds to the organic EL panel described above with reference to embodiments.

Figure 24A:
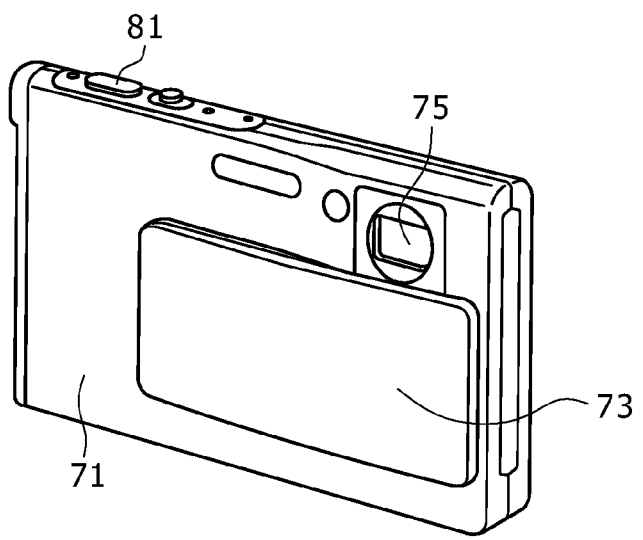
FIGS. 24A and 24B are schematic diagrams illustrating an exemplary electronic equipment product.
Figure 24B:
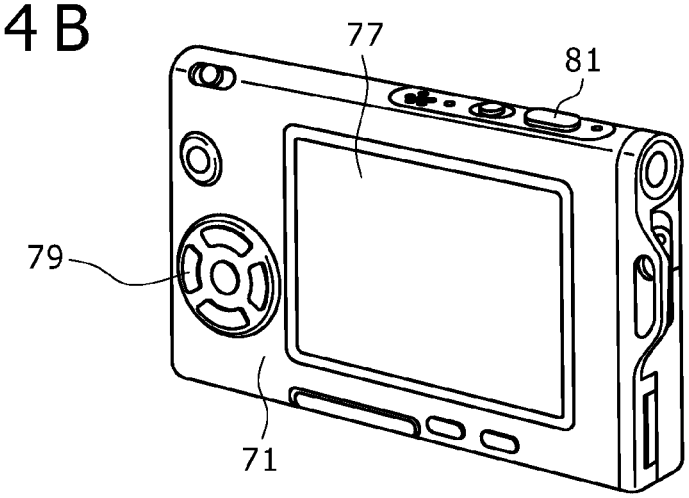

In addition, for the electronic device 51 of this type, a digital camera is assumed, for example. FIG. 24 show external views example of a digital camera 71. FIG. 24A shows the front side (the side of a subject to be taken). FIG. 24B shows an external view example of the rear side (the side of photographer).

The digital camera 71 has a protection cover 73, a taking lens block 75, a display screen 77, a control switch 79, and a shutter button 81. The portion of the display screen 77 corresponds to the organic EL panel described above with reference to embodiments.

Figure 25:
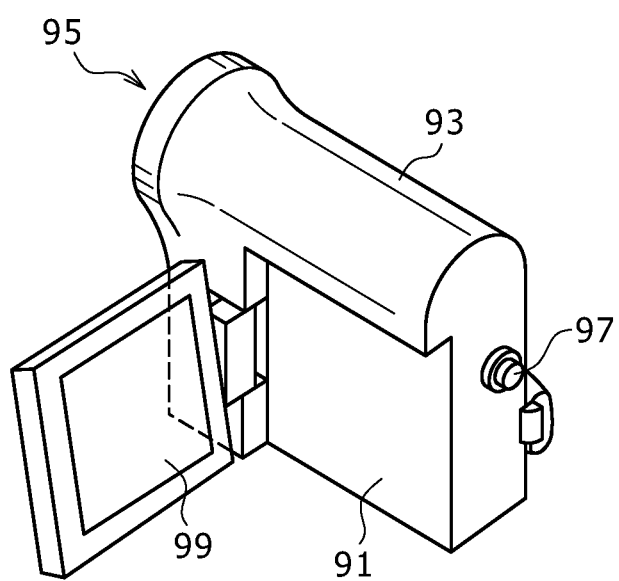
FIG. 25 is a schematic diagram illustrating an exemplary electronic equipment product.

Besides, for the electronic device 51 of this type, a video camera is assumed, for example. FIG. 25 shows an external view example of a video camera 91. The video camera 91 has a taking lens 95 for taking a subject on the front side of a body 93, a shooting start/stop switch 97, and a display screen 99. Of these components, the portion of the display screen 89 corresponds to the organic EL panel described above with reference to embodiments.

Figure 26A:
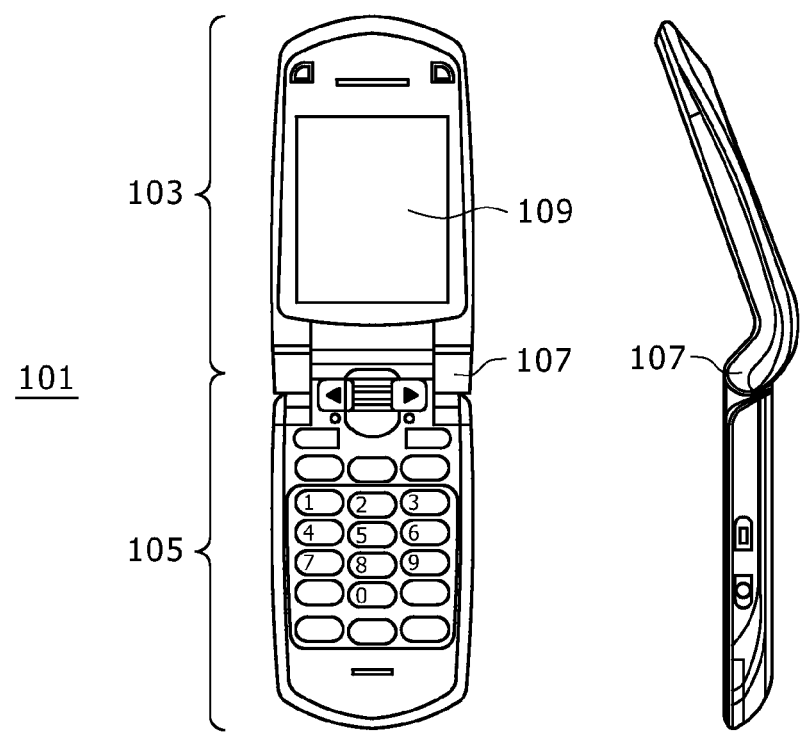
FIGS. 26A and 26B are schematic diagrams illustrating an exemplary electronic equipment product.
Figure 26B:
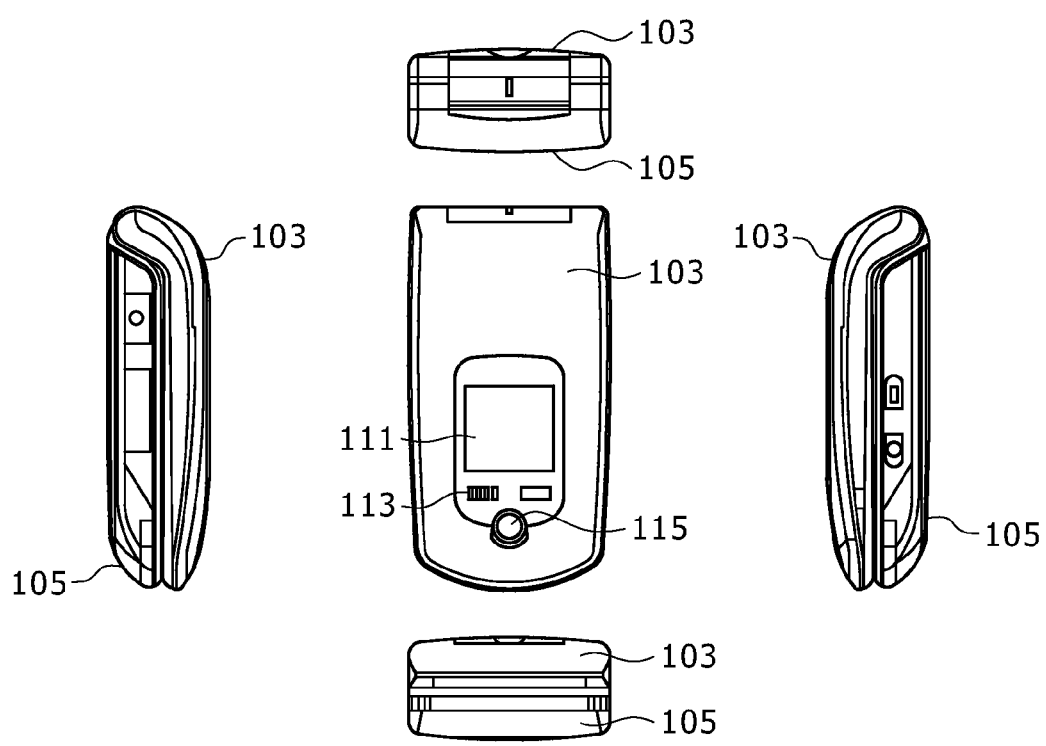

Moreover, for the electronic device 51 of this type, a portable terminal device is assumed, for example. FIG. 26 show external views example of a mobile phone 101, for example, as a portable terminal device. The mobile phone 101 shown in FIG. 26 is of folding type. FIG. 26A shows an external view example in which the mobile phone is in the opened state. FIG. 26B shows an external view example in which the mobile phone is in the closed state.

The mobile phone 101 has an upper housing 103, a lower housing 105, a link block 107 (a hinge block in this example), a display screen 109, an auxiliary display screen 111, a picture light 113, and a taking lens 115. Of these components, the portions of the display screen 109 and the auxiliary display screen 111 correspond to the organic EL panel described above with reference to embodiments.

Figure 27:
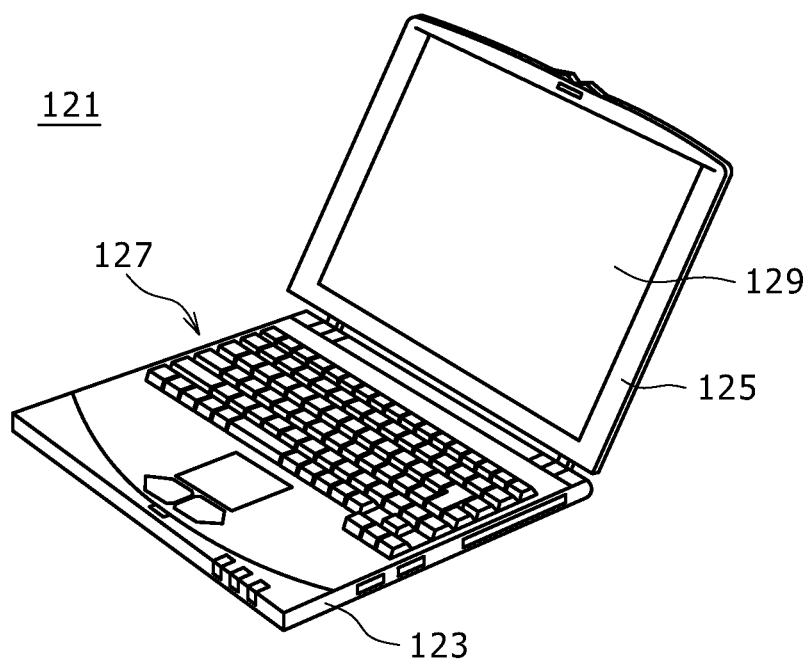
FIG. 27 is a schematic diagram illustrating an exemplary electronic equipment product.

Also, for the electronic device 51 of this type, a computer is assumed, for example. FIG. 27 shows an external view example of a note-type computer 121. The note-type computer 121 has a lower housing 123, an upper housing 125, a keyboard 127, and a display screen 129. Of these components, the portion of the display screen 129 corresponds to the organic EL panel described above with reference to embodiments.

In addition to the above-mentioned devices, audio players, game machines, electronic books, and electronic dictionaries, for example, are assumed for the electric device 51.

(C-2) Other Display Device Examples

The above-mentioned driving method is also applicable to other than the organic EL panel. For example, the above-mentioned driving method is applicable to inorganic EL panels, LED-type display panels, and EL light-emitting type display panels with light-emitting elements having diode structure arranged on the screen.

(C-3) Others

While preferred embodiments of the present invention have been described using specific terms, such description is for illustrative purpose, and it is to be understood that changes and variations may be made without departing from the spirit or scope of the following claims.

It should be understood by those skilled in the art that various modifications, combinations, sub-combinations and alterations may occur depending on design requirements and other factor in so far as they are within the scope of the appended claims or the equivalents thereof.

What is claimed is:

1. An electroluminescence display device comprising a plurality of pixel circuits and a pixel driving circuit,
   wherein each of the plurality of pixel circuits includes an electroluminescence element, and
   wherein in a layout pattern of the pixel driving circuit:
      an output line is electrically directly connected to a first source/drain region of a first transistor of a buffer circuit and a first source/drain region of a second transistor of the buffer circuit, a row of pixel circuits being electrically directly connected to said output line;
      a different output line is electrically directly connected to a first source/drain region of a third transistor of a different buffer circuit and a first source/drain region of a fourth transistor of the different buffer circuit, a different row of pixel circuits being electrically directly connected to said different output line;
      a high-potential power supply line is electrically directly connected a second source/drain region of the first transistor to a second source/drain region of the third transistor, said high-potential power supply line not crossing said output line or said different output line;

a low-potential power supply line is electrically directly connected a second source/drain region of the second transistor to a second source/drain region of the fourth transistor, said low-potential power supply line not crossing said output line or said different output line, wherein the high-potential power supply line and the low-potential power supply line are extending in a column direction, and wherein the high-potential power supply line and the low-potential power supply line are disposed on an input side of the buffer circuit.

2. The electroluminescence display device according to claim 1, wherein the first transistor and the second transistor are configured to be switched complementally.

3. The electroluminescence display device according to claim 1, wherein the low-potential power supply line is disposed between the high-potential power supply line and the buffer circuit.

4. The electroluminescence display device according to claim 1, wherein the pixel driving circuit is configured to supply a control signal to the pixel circuit.

5. The electroluminescence display device according to claim 4, wherein the control signal is configured to control between an ON-state and an OFF-state of the electroluminescence element.

6. An electronic device comprising:
the electroluminescence display device according to claim 1;
a system control block; and
an operation input block for said system control block.

7. An electroluminescence display device comprising a plurality of pixel circuits and a pixel driving circuit,
wherein each of the plurality of pixel circuits includes an electroluminescence element, and
wherein in a layout pattern of the pixel driving circuit:
an output line is electrically directly connected to a first source/drain region of a first transistor of a buffer circuit and a first source/drain region of a second transistor of the buffer circuit, a row of pixel circuits being electrically directly connected to said output line;

a different output line is electrically directly connected to a first source/drain region of a third transistor of a different buffer circuit and a first source/drain region of a fourth transistor of the different buffer circuit, a different row of pixel circuits being electrically directly connected to said different output line;

a first supply line is electrically directly connected a second source/drain region of the first transistor to a second source/drain region of the third transistor, said first supply line not crossing said output line or said different output line;

a second supply line is electrically directly connected a second source/drain region of the second transistor to a second source/drain region of the fourth transistor, said second supply line not crossing said output line or said different output line, wherein the first supply line and the second supply line are extending in a column direction, and wherein a gate electrode of the first transistor and a gate electrode of the third transistor overlap the first supply line and the second supply line.

8. The electroluminescence display device according to claim 7, wherein the first transistor and the second transistor are configured to be switched Complementally.

9. The electroluminescence display device according to claim 7, wherein the pixel driving circuit is configured to supply a control signal to the pixel circuit.

10. The electroluminescence display device according to claim 7, wherein the control signal is configured to control between an ON-state and an OFF-state of the electroluminescence element.

11. An electronic device comprising:
the electroluminescence display device according to claim 7;
a system control block; and
an operation input block for said system control block.

* * * * *

UNITED STATES PATENT AND TRADEMARK OFFICE
CERTIFICATE OF CORRECTION

| | |
|---|---|
| PATENT NO. | : 8,912,988 B2 |
| APPLICATION NO. | : 14/269644 |
| DATED | : December 16, 2014 |
| INVENTOR(S) | : Masatsugu Tomida et al. |

It is certified that error appears in the above-identified patent and that said Letters Patent is hereby corrected as shown below:

On the Title Page Item (63) Related U.S. Application Data section:

"12/589,609" should be corrected to -- 13/589,609 --.

Signed and Sealed this
Fifth Day of May, 2015

Michelle K. Lee
*Director of the United States Patent and Trademark Office*